United States Patent
Tautenhahn et al.

(10) Patent No.: US 11,858,845 B2
(45) Date of Patent: Jan. 2, 2024

(54) METHOD FOR PROCESSING A TRANSPARENT COVER PLATE AND COVER PLATE

(71) Applicant: CNBM RESEARCH INSTITUTE FOR ADVANCED GLASS MATERIALS GROUP CO., LTD., Bengbu (CN)

(72) Inventors: Lutz Tautenhahn, Dresden (DE); Robert Heinhold, Fürth (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 17/761,599

(22) PCT Filed: Sep. 18, 2020

(86) PCT No.: PCT/CN2020/116119
§ 371 (c)(1),
(2) Date: Mar. 18, 2022

(87) PCT Pub. No.: WO2021/052456
PCT Pub. Date: Mar. 25, 2021

(65) Prior Publication Data
US 2022/0267206 A1  Aug. 25, 2022

(30) Foreign Application Priority Data

Sep. 20, 2019 (EP) .................................. 19198529

(51) Int. Cl.
*C03C 27/10* (2006.01)
*H01L 31/0224* (2006.01)
(Continued)

(52) U.S. Cl.
CPC ........ *C03C 27/10* (2013.01); *B32B 17/10018* (2013.01); *H01L 31/02165* (2013.01);
(Continued)

(58) Field of Classification Search
CPC ................ C03C 27/10; C03C 2218/34; C03C 2218/365; C03C 17/00; C03C 27/00;
(Continued)

(56) References Cited

U.S. PATENT DOCUMENTS

2006/0137735 A1* 6/2006 Kobayashi ............ H01L 31/076
136/246
2009/0095341 A1* 4/2009 Pfenninger ........... H01L 31/055
136/246
(Continued)

FOREIGN PATENT DOCUMENTS

| CN | 101666886 A | 3/2010 |
| CN | 102126831 A | 7/2011 |

(Continued)

OTHER PUBLICATIONS

Benedikt Bläsi, et al., Morpho Butterfly Inspired Coloured Bipv Modules, 33rd European PV Solar Energy Conference and Exhibition, Sep. 24-29, 2017, Amsterdam, The Netherlands.
(Continued)

*Primary Examiner* — Yasser A Abdelaziez
(74) *Attorney, Agent, or Firm* — Bayramoglu Law Offices LLC

(57) ABSTRACT

A method for processing a transparent cover plate for a flat body includes the following steps of providing the transparent cover plate having an outer side and an opposite inner side, wherein the transparent cover plate includes a structured area with a light-scattering structure, forming of at least one optical interference layer on a cover plate side including applying a mask to the transparent cover plate,
(Continued)

wherein the mask does not cover a first area of a cover plate surface and covers a second area of the cover plate side, and the first area and the second area are arranged to overlap the structured area, the at least one optical interference layer is applied in overlap with the mask, and removing of the mask, whereby the at least one optical interference layer is also removed.

20 Claims, 13 Drawing Sheets

(51) Int. Cl.
*H01L 31/0236* (2006.01)
*B32B 17/10* (2006.01)
*H01L 31/0216* (2014.01)
*H01L 31/18* (2006.01)

(52) U.S. Cl.
CPC .......... *H01L 31/02366* (2013.01); *H01L 31/022466* (2013.01); *H01L 31/18* (2013.01); *C03C 2218/34* (2013.01); *C03C 2218/365* (2013.01)

(58) Field of Classification Search
CPC .......... B32B 17/10018; B32B 17/1011; B32B 2457/12; B32B 17/10036; B32B 17/10761; B32B 17/10174; B32B 7/023; B32B 3/18; B32B 7/12; B32B 2307/416; H01L 31/02165; H01L 31/022466; H01L 31/02366; H01L 31/18; H01L 31/048; Y02B 10/20; G02B 5/286; G02B 5/0294; F24S 2023/86; B41F 1/18; B41M 1/06; B41M 1/12; Y02E 10/50
See application file for complete search history.

(56) References Cited

U.S. PATENT DOCUMENTS

| | | | |
|---|---|---|---|
| 2009/0293955 A1 | 12/2009 | Kothari et al. | |
| 2010/0060987 A1* | 3/2010 | Witzman | B42D 25/36 427/162 |
| 2010/0181014 A1* | 7/2010 | Raymond | G02B 17/086 156/209 |
| 2016/0064577 A1 | 3/2016 | Ballif et al. | |
| 2021/0313480 A1* | 10/2021 | Kalio | H01L 31/0549 |

FOREIGN PATENT DOCUMENTS

| | | |
|---|---|---|
| CN | 102356473 A | 2/2012 |
| CN | 105144397 A | 12/2015 |
| CN | 106233168 A | 12/2016 |
| EP | 3599318 A1 | 1/2020 |
| EP | 3599647 A1 | 1/2020 |
| EP | 3599649 A1 | 1/2020 |
| WO | 2013056747 A1 | 4/2013 |
| WO | 2014045141 A2 | 3/2014 |
| WO | 2015155357 A1 | 10/2015 |
| WO | 2018154045 A1 | 8/2018 |

OTHER PUBLICATIONS

EN ISO 11664-4, Colorimetry—Part 4: CIE 1976 L*a*b* Colour Space, CIE DS 014-4.3/E, 2007, pp. 1-8.

DIN 5033-9, Colorimetry—Part 9: Reflectance standard for calibration in colorimetry and photometry, BEST BeuthStandards Collection, 2018, pp. 1-12.

ISO/CIE 10527, CIE Standard colorimetric observers, 1991, pp. 1-6.

ISO 7724/1, Paints and vainishes—Colorimetry—Part 1: Principles, International Standard, 1984, pp. 1-5.

ASTM E1347, Standard Test Method for Color and Color-Difference Measurement by Tristimulus (Filter) Colorimetry1, ASTM International, 1997, pp. 1-4.

ASTM 01003, Standard Test Method for Haze and Luminous Transmittance of Transparent Plastics1, ASTM International, 2000, pp. 1-6.

* cited by examiner

FIG. 7A
FIG. 7B
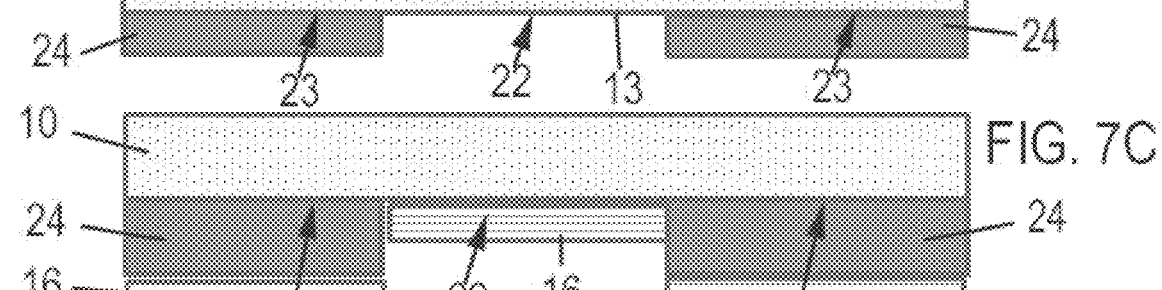
FIG. 7C
FIG. 7D
FIG. 7E
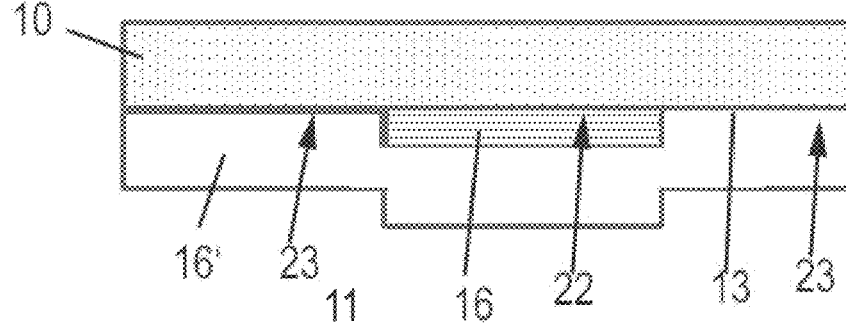
FIG. 7F
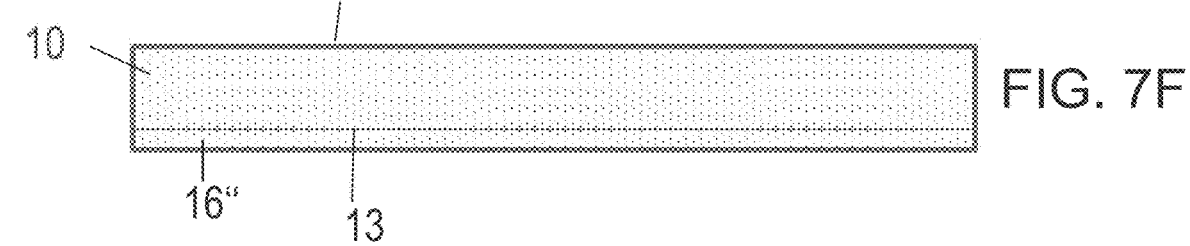

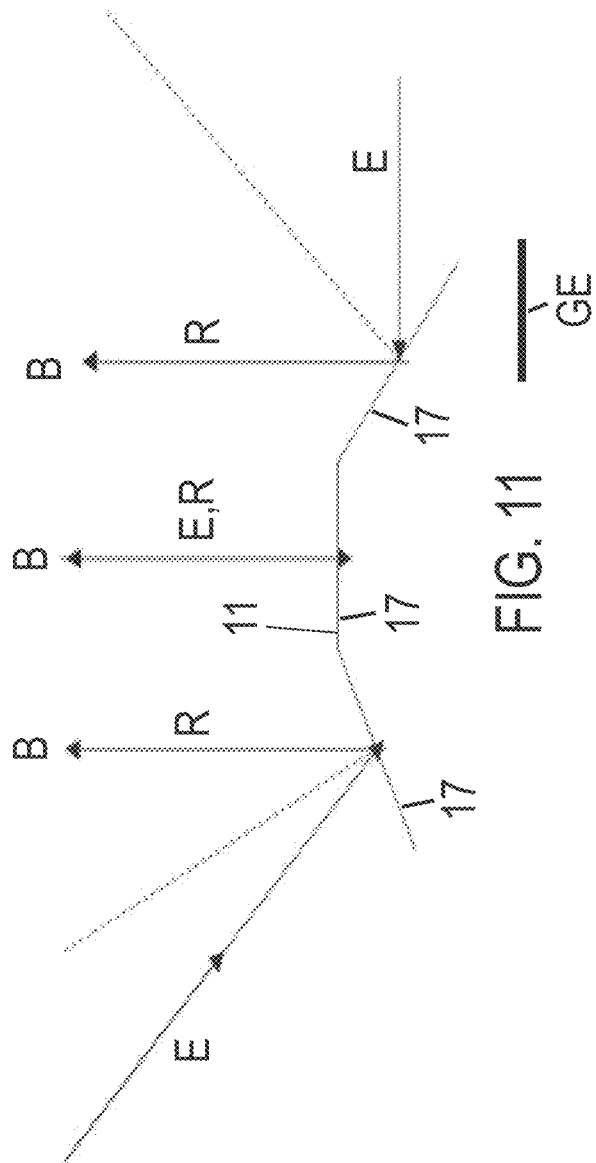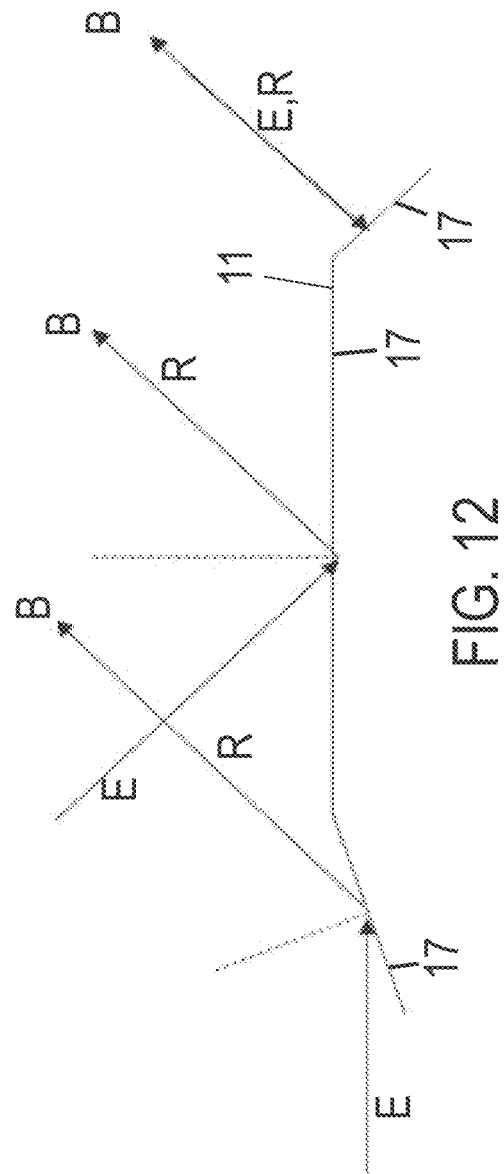

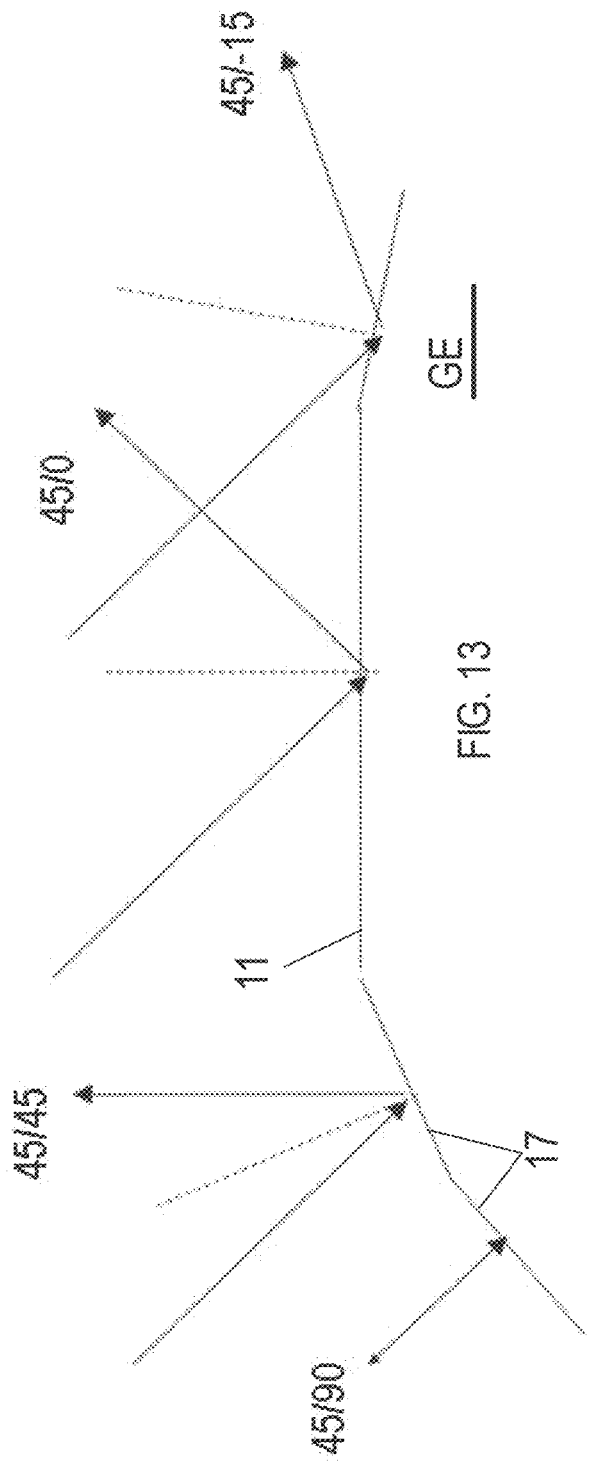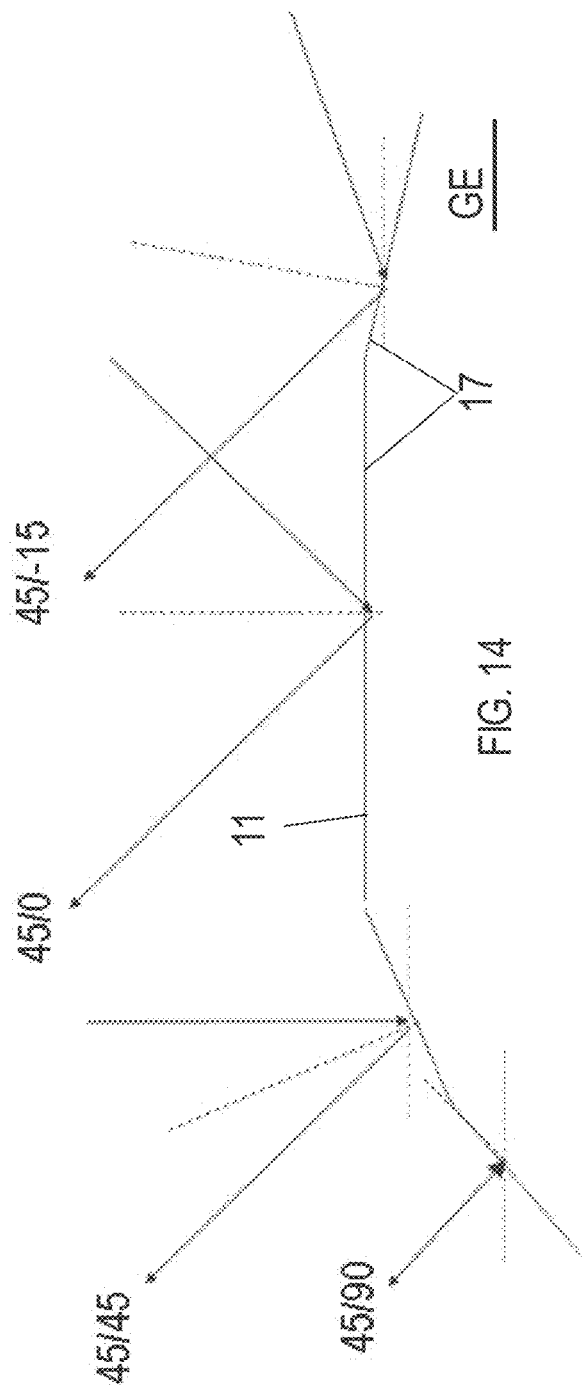

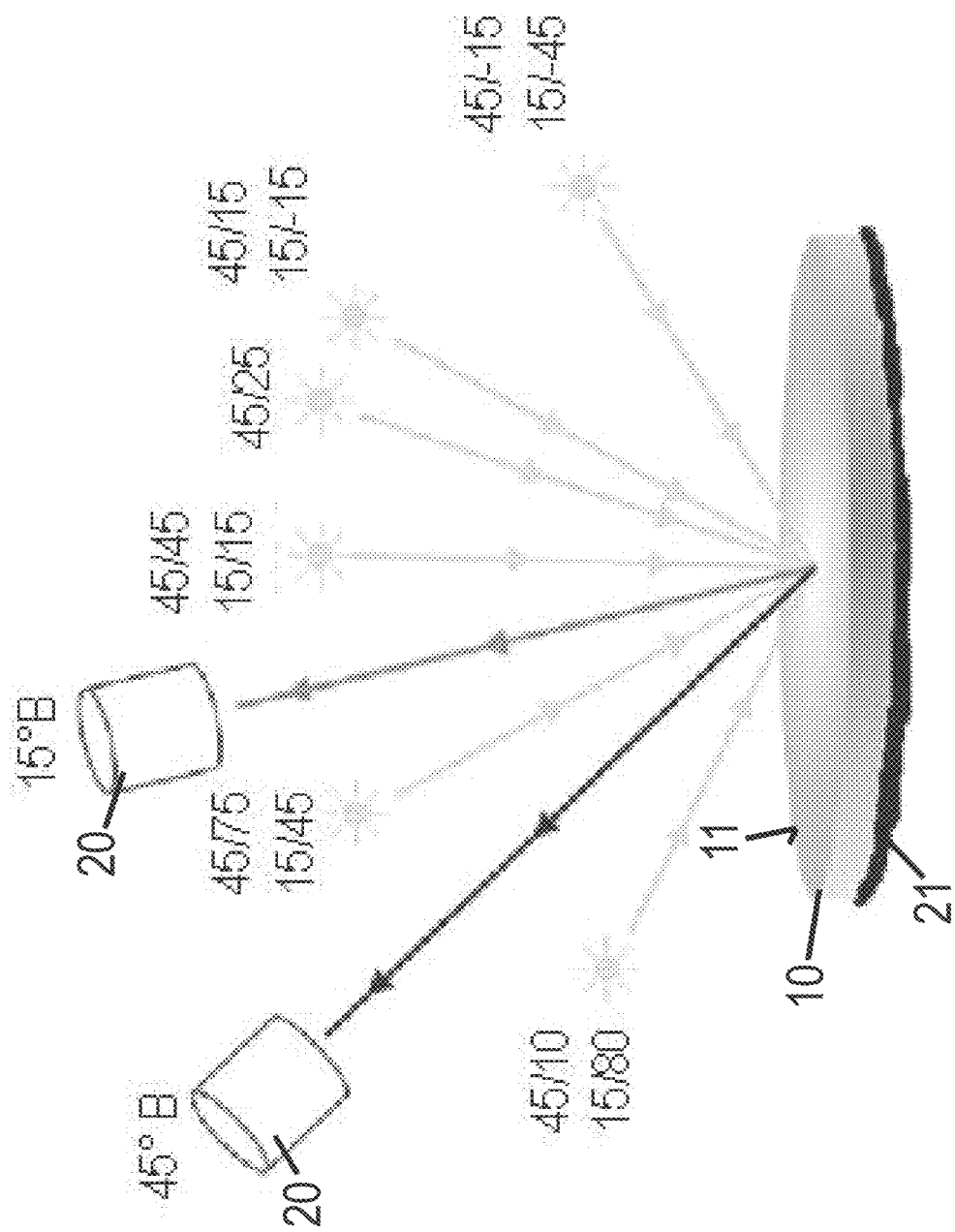

METHOD FOR PROCESSING A TRANSPARENT COVER PLATE AND COVER PLATE

CROSS REFERENCE TO THE RELATED APPLICATIONS

This application is the national stage entry of International Application No. PCT/CN2020/116119, filed on Sep. 18, 2020, which is based upon and claims priority to European Patent Application No. 19198529.0, filed on Sep. 20, 2019, the entire contents of which are incorporated herein by reference.

TECHNICAL FIELD

The present invention lies in the technical field of the production of light-absorbing flat bodies, such as solar modules and solar collectors, as well as passive flat bodies, which are intended to serve as integrated components of a building envelope or freestanding wall and merely fulfil an architectural function.

BACKGROUND

Solar modules for photovoltaic energy generation from sunlight and solar collectors for converting sunlight into heat energy are well known from everyday life. Here and further, solar modules and solar collectors are collectively referred to as "light-absorbing flat bodies". Light-absorbing flat bodies are used to generate energy from sunlight or to convert sunlight into heat energy. They are also referred to as "active" flat bodies, in contrast to "passive" flat bodies, which are neither suitable nor intended for this purpose.

A solar module comprises a photoactive semiconductor layer, which serves to directly convert sunlight into electric current. The term "thin-film solar module" refers to layer systems with thicknesses of only a few micrometers, which require a carrier substrate for sufficient mechanical strength. Known carrier substrates are usually made of glass or plastic and can be configured as rigid plates or flexible films, depending on the respective layer thickness and the specific material properties. It is well known that thin-film solar modules are formed in the form of composite panes in which the photoactive semiconductor layer is located between two individual panes usually made of glass which are firmly connected to each other by a thermoplastic intermediate layer. Sunlight can strike the photoactive semiconductor layer through the cover pane (e.g cover glass).

Solar collectors typically comprise a housing with an absorber and a heat transfer medium (fluid) circulating in a pipe system. The housing is closed on the light inlet side by a cover plate. The absorber is heated by sunlight passing through the cover plate (e.g. cover glass) and transfers its energy to the heat transfer medium, which is thermally coupled to a buffer storage tank located at a distance from the solar collector, which makes the heat energy usable.

A large increase in light-absorbing flat bodies, especially solar modules, can be observed in open space systems. However, applications in the building-integrated environment are currently still on a much smaller scale. In view of increased efforts for decentralized energy solutions, there is a specific need for applications as integrated components of building shells, for example as facades, window or roof elements. Other areas of application are free-standing walls such as noise barriers (road, rail), exterior privacy walls or walls for greenhouses.

These new applications place completely new demands on light-absorbing flat bodies, especially aesthetics, durability and other functionalities such as sealing and thermal insulation. Different shapes, sizes and colors are to be available and the color impressions to be as homogeneous as possible. However, there are technical problems that conflict with the actual functionality of light-absorbing flat bodies. An ideal light absorbing flat body would be a black body that completely absorbs the incident sunlight in order to use the incident radiation energy optimally. However, any real body reflects incident radiation and remits absorbed radiation. The color impression in the human eye is basically the result of spectrally selected reflection and the remission of visible light. If a light-absorbing flat body is colored, i.e. if a color impression is to be created in the human eye that differs from that of an ideal black body, the intensity of the light absorbed in the optically active semiconductor and thus the electrical power and the efficiency of the solar module will be reduced. With a solar collector, the heat absorbed by the absorber is reduced and the efficiency of the solar collector is also reduced.

Solar modules and solar collectors have in common that the cover plate on the light entry side can be used to achieve a color effect. Various methods are known for this.

From the international patent application WO 2014/045141 the use of an optical filter consisting of a multiple stack of at least three up to nine interference layers on the inside of a deck glass is known. The optical filter layer reflects a defined spectral range of the sunlight, resulting in the color effect. Also shown is the use of diffusely scattering cover glass, where the optical interference layer and the roughened side of the cover glass are on different sides of the cover glass (interference layer inside, roughening outside) and the optical and structural properties of the cover glass are not further described. The color impression is homogenized by the surface structuring. Angular stability, however, is achieved by the complex adjustment of special reflection spectra through the layer structure of multiple layers. Since the perceived color depends to a large extent on the layer thicknesses and refractive indices, the individual interference layers must be deposited as homogeneously as possible (i.e. with uniform layer thickness). The loss of efficiency in coloration by an optical interference layer is acceptable. However, the series production of multiple layers with up to 9 layers with precisely adjusted refractive indices and layer thicknesses on areas of one or more square meters is technologically very demanding and associated with high costs.

The use of bionic methods in which nanostructures similar to those of butterflies are created is also well known (see Fraunhofer, Blasi et al. 33rd European PV Solar Energy Conference and Exhibition, 24-29 Sep. 2017, Amsterdam, The Netherlands). These methods are very complex and cost-intensive and are not yet suitable for the industrial mass production of large-area solar modules and solar collectors.

The application of colors to cover glass by ceramic screen printing or the use of organic glass colors is also known. These are comparatively inexpensive technologies that can also produce a wide range of colors In addition, the color impression is only slightly dependent on angle. However, the color layers as such are basically opaque and largely light-absorbing, so the loss of efficiency is inevitably very high. This applies in particular to light color shades, which generally lead to an unacceptable loss of efficiency.

In this respect, only the use of optical interference coatings currently offers the possibility of achieving a color effect with an acceptable loss of efficiency in a light-absorbing flat body. So far, however, only the monochrome embodiment of the cover glass by means of an optical interference layer is known, corresponding to the spectral range reflected by the optical interference layer. The color effect typically results from a combination of the reflected color and the color of the background. Since the optical interference layer is located all over the visible area of the flat body, the flat body has essentially the same color, depending on the color of the background. However, the monochrome embodiment of the flat body considerably limits the creative freedom.

SUMMARY

In light of the above, the object of the present invention is to provide a multi-colored, in particular two-colored, flat body. It should be possible to produce the flat body in industrial series production easily and with relatively short production times using common methods. The multi-colored coloring of the flat body shall only slightly affect the efficiency of a light-absorbing flat body. In addition, the colors should depend as little as possible on the viewing and irradiation angle, since otherwise, when used in a building-integrated environment, the colors would depend strongly on the location of the observer or the position of the sun. For industrial series production, it is also important that the flat bodies can be produced on large areas, at acceptable costs and with satisfactory homogeneity.

With regard to the specific embodiment of a facade, especially functional elements such as windows, doors and balconies, it may be necessary to use colored flat bodies in various sizes and shapes. The problem with light-absorbing flat bodies is that, in principle, it is technically possible to produce them in different sizes and shapes, but smaller and non-rectangular shapes lead to considerable additional costs, which is not economically desirable. To solve this problem it would be conceivable to use facade elements made of plate metal or other conventional building materials. However, there is a technical problem here, which lies in the nature of color production. In fact, the color of light-absorbing flat bodies can change depending on the origin of the color (absorption/emission, interference, refraction) under different lighting conditions, especially depending on the type of light (diffuse, direct, color of light), and by changing the angle of incidence and/or the angle of observation. If the facade elements are made of different materials than the colored light-absorbing flat bodies, this results in typically white color contrasts, which are undesirable Therefore, it would be desirable to have passive facade elements that avoid these disadvantages and allow a simple multicolored color configuration.

According to the proposal of the invention, these and further objects are solved by a method for processing a transparent cover plate for a flat body, a method for manufacturing a flat body, as well as a transparent cover plate and a flat body with a transparent cover plate according to the coordinated claims Advantageous embodiments of the invention are indicated by the features of the subclaims.

For the purposes of the present invention, "flat body" is understood to be a flat, preferably planar body with a transparent cover plate facing the external environment, which can be a light-absorbing flat body, such as a solar module or a solar collector, or a passive flat body which merely fulfils a structural function and is not suitable for generating and converting energy on the basis of sun light. In principle, any type of solar module can be realized as a solar module, in particular a silicon-based wafer-based solar module or a thin-film solar module with solar cells connected in series in a monolithically integrated form.

The flat body allows the passage of sunlight into the interior of the flat body. In general, the flat body has one or typically several components on the rear side, i.e. on the side facing away from the light entry side. The preferably opaque rear side element is preferably, but not necessarily, firmly connected to the transparent cover plate. The rear side element can have one or more colors, which are typically determined by its components. The background color of the flat body is given by the color of the rear side element.

In a solar module, the rear side element comprises the solar cells and other electrical components such as strip-shaped busbars and, depending on the embodiment, a cover or base plate. Typically, the base plate with solar cells is firmly connected to the cover plate via a thermoplastic intermediate layer. The color of the rear side element of a solar module is essentially determined by the color of the solar cells. In thin-film solar modules, the optically active cell area is usually black, anthracite grey or with residual shades of dark blue and green. In silicon wafer modules, the optically active cell area is usually blue. In a solar collector, the rear side element typically comprises a housing, an absorber and a heat transfer medium (fluid) in tubes. In solar collectors, the rear side element is typically black. In a passive flat body, the rear side element is typically opaque and black.

Colored solar modules whose cover plate has at least one structured area and at least one optical interference layer are described in the unpublished European patent applications EP 18186153.5 and EP 18186161.8. With regard to embodiment, function and use of these solar modules, full reference is made to the disclosure of these two European patent applications.

Preferably, colored passive facade elements are used in a facade in combination with colored solar modules. Colored passive facade elements are described in the unpublished European patent application EP 18186175.8. With regard to the embodiment, function and use of facade elements, full reference is made to the disclosure of this European patent application.

According to the invention, a method for processing a transparent cover plate for a flat body is shown.

The method involves providing a transparent cover plate with an outer side that is to face an external environment and an opposite inner side. Accordingly, the cover plate has two opposing cover plate surfaces, namely an outer surface which is associated with the outer side and an inner surface which is associated with the inner side. The cover plate has a structured area with a light diffusing structure in at least one cover plate surface selected from the outer surface and inner surface. The structured area has a light scattering structure, as explained below. The structured area may consist of a single section of the cover plate surface. Similarly, it is possible for the structured area to comprise several sections of the cover plate surface that are spatially separated from each other. Preferably, the cover plate surface has a structured area over the entire surface, with the exception of an edge area, which may not have a structured area.

Alternatively, it is possible to provide a non-structured transparent cover plate, whereby at least one structured area with a light-scattering structure is formed in at least one cover plate surface selected from outer and inner surfaces. The formation of the structured area can be carried out before or after the formation of at least one optical interference layer described below.

The method further comprises the formation of at least one optical interference layer on a part of one side of the cover plate, selected from the outer side and the inner side.

For the purposes of the present invention, "part" or "partial area" is understood to mean the incomplete coverage of the cover plate surface, with respect to a vertical view through the cover plate, as opposed to "full area", which indicates complete coverage. If a layer is applied directly to a part of the cover plate surface, the layer only partially, not completely, covers the cover plate surface. If a full-surface layer is applied directly to the cover plate surface, the layer covers the cover plate surface completely. If the layer is not applied directly to the cover plate surface, but one or more other layers are located in between, this applies in a corresponding manner to the (orthogonal) projection of the layer onto the cover plate surface when viewed vertically through the cover plate surface, whereby the term "overlap" is used instead of "covering". A cover plate surface can be divided into an area overlapped by a layer and an area not overlapped. An "area" may consist of one or more contiguous sections of the cover plate surface. The cover plate surface can be composed of the overlapped area and the nonoverlapped area, but it is equally possible that the overlapped area and the nonoverlapped area affect only a part of the cover plate surface, for example excluding a surrounding edge area of the cover plate surface. It is advantageous that the uncovered area of the cover plate surface is arranged inside, i.e. is completely surrounded by a covered area of the cover plate surface.

The partial area formation of at least one optical interference layer on the selected cover plate side comprises the application of a mask to the cover plate on the selected cover plate side, wherein in vertical view through the cover plate the mask does not cover a first area of the cover plate surface of the cover plate side and covers a second area of the cover plate surface of the cover plate side In addition, the first area and the second area are arranged in vertical view through the cover plate in overlap to the already formed or possibly still to be formed structured area. It is advantageous that the complete first area and the complete second area overlap the structured area in vertical view through the cover plate. The mask can be arranged directly (i.e. without further intermediate layer) on the cover plate surface. However, it is possible that one or more intermediate layers are located between the mask and the cover plate surface.

Subsequently, at least one (first) optical interference layer for reflecting light within a predetermined or pre-determinable wavelength range is applied to the cover plate on the selected cover plate side, the optical interference layer being applied in perpendicular view through the cover plate in overlap with the mask (i.e. in overlap with the second area of the cover plate surface) and in overlap with the first area of the cover plate surface not covered by the mask. The optical interference layer can be placed directly (i.e. without any further intermediate layer) on the mask as well as on the cover plate surface. However, it is possible that one or more intermediate layers are located in between. Preferably, the optical interference layer is applied to the complete cover plate surface which is partially covered by the mask.

Afterwards the mask is removed, whereby the optical interference layer (e.g. optical inference layer covering the mask directly) is also removed.

As used here and further, the term "vertical view through the cover plate" refers to an orthogonal projection (i.e., vertical extension) of a structure onto a surface that is parallel to the plane of the cover plate. Vertical here means perpendicular to the plane of the cover plate. The plane of the cover plate is the plane in which the cover plate extends.

Preferably, the cover plate has no curvature and is therefore flat (even). However, the cover plate can also be curved. The cover plate can be rigid or flexible. In the form of a flexible cover plate, it can be provided in a flat form, so to speak. In the case of a flat (plane) cover plate, the extension of the cover plate itself defines a plane, which is to be understood as "plane of the cover plate" in the sense of the invention. In case of a curved cover plate, a local plane can be defined by an (imaginary) plane tangential surface at any point of the plane, which also falls under the term "plane of the cover plate".

The mask can be applied by means of known techniques, such as lithography, digital printing or screen printing. The material of the mask is optional, provided that it can be removed from the cover plate without damaging it. For example, a coating with a thickness in the micrometer range can be used as a mask. It is also possible to use an adhesive tape as a mask.

As already explained, according to an alternative, the formation of the structured area with a light-scattering structure in the outer and/or inner surface of the cover plate can be performed temporally before or after the partial formation of the (first) interference layer, unless the optical interference layer is applied to the structured area, which necessarily determines the temporal sequence, i.e the formation of the structured area temporally before the application of the mask.

According to the invention, a transparent cover plate with at least one partial optical interference layer can thus be produced in a simple and cost-effective manner by using a mask that only partially covers the cover plate surface (outer and/or inner surface). Specifically, the cover plate surface has the optical interference layer in a vertical view through the cover plate in the first area that was not covered by the mask and does not have the optical interference layer in the second area that was covered by the mask. As a result, the interference layer, which was only applied to a part, leads to a partially different color effect of the cover plate or flat body, corresponding to the reflection of light within a given wavelength range. More precisely, a total color is obtained by combining the color of the back element and the color of the light reflected by the at least one optical interference layer. For example, in CIGS thin-film solar modules, the photovoltaic active solar cells have a bluish-black color and thus contribute to the overall color of the flat body in the area of the optical interference layer In the second area of the surface not covered by the (first) optical interference layer, such a color effect is not present if no further optical interference layer is provided (see below). In this case, the color of the area is mainly determined by the background color visible through the cover plate (i.e. color of the rear side element). For this purpose the cover plate is color neutral. Of course, the background color of the rear side element can also be changed by tinting the transparent cover plate. For example, in CIGS thin-film solar modules, the bluish-black color of the photovoltaic active solar cells can be seen in the areas without optical interference layer In CIGS thin-film solar modules and generally in solar modules, the background color is determined by the color of the solar cells. The solar cells cover most of the cover plate, for example at least 90%, and in particular at least 95%. In the case of a passive flat body, for example, the back flat body is uncolored, dark and matt. It is also possible that the rear side element is colored. As explained below, the cover plate may have one or more additional optical interference layers.

In this case, locally different colors result, depending on whether after removing the mask locally (second area) only the first optical interference layer or also at least one further optical interference layer is present. The (first) optical interference layer can be formed on a part of one or both sides of the cover plate.

In accordance with an advantageous embodiment of the method according to the invention, after partial area formation of the (first) optical interference layer, at least one further (second) optical interference layer for reflection of light within a predetermined or predeterminable wavelength range is applied to the cover plate on the selected cover plate side, the (second) optical interference layer overlapping the first area and the second area of the cover plate surface when viewed vertically through the cover plate. The at least one (second) optical interference layer is thus applied in particular to the already applied (first) optical interference layer. Preferably, but not necessarily, the (second) optical interference layer is applied directly, i.e. without any further intermediate layer.

In accordance with a further advantageous embodiment of the method according to the invention, a transparent cover plate is provided, which has on the selected cover plate side and/or the non-selected cover plate side at least one further (third) optical interference layer for reflection of light within a predetermined wavelength range, wherein the (third) optical interference layer covers the first area and the second area of the cover plate surface of the selected cover plate side when viewed vertically through the cover plate.

According to the above embodiments of the method according to the invention, the cover plate can have at least one second optical interference layer which is located (from the viewpoint of the cover plate) above the at least one first optical interference layer (i.e. the at least one first optical interference layer is located between the cover plate surface and the at least one second optical interference layer). Alternatively or in addition, the cover plate may have at least one third optical interference layer which (as seen from the cover plate) is located below the at least one first optical interference layer (i.e. the at least one third optical interference layer is located between the cover plate surface and the at least one first optical interference layer). It is essential here that the at least one further optical interference layer (at least one second optical interference layer and/or at least one third optical interference layer) completely covers the at least one (first) partial optical interference layer when viewed vertically through the cover plate and is also arranged in the second area of the cover plate surface not covered by the (first) partial optical interference layer. Thus the at least one first partial area optical interference layer and the at least one second optical interference layer are superimposed on each other, the at least one second optical interference layer being formed even without being superimposed on the first partial-area optical interference layer. Alternatively or additionally, the at least one first partial-area optical interference layer and the at least one third optical interference layer are superimposed on one another, the at least one third optical interference layer also being formed without superimposition with the first partial-area optical interference layer (but optionally in superimposition with the at least one second optical interference layer).

In addition, a cover plate can be provided which has at least a third optical interference layer on the non-selected cover plate side.

For example, the flat body can have at least two freely selectable colors, namely a first color that results in the first area of the surface from reflection of light at two optical interference layers lying one above the other (first and second optical interference layer), and a second color that results in the second area of the surface from reflection of light only at the second optical interference layer. The color impression results in each case from a combination of the color from reflection at the optical interference layer(s) and the color of the background of the surface. It is therefore advantageous to use at least one optical interference layer to give the complete cover plate, i.e. also in areas of the cover plate that were previously covered by the mask and do not have an optical interference layer, a specific two-color embodiment, whereby the two colors can be freely selected.

Thus, the flat body can easily be configured in two colors, especially multi-colored. One color is created by one or more superimposed optical interference layers in combination with the background color of the rear side element and at least one more color is created by the background color of the rear side element. In a particularly advantageous way, for example, a colored pattern or colored characters encoding an information can be displayed against a background of a different color.

According to an advantageous embodiment of the invention, the partial-area formation of the at least one first optical interference layer can be repeated once or several times. In particular, the at least one (first) optical interference layer can be formed on both sides of the cover plate. It is also possible that the first optical interference layer is formed several times on the same side of the cover plate. In case of a repetition, the different steps for the partial-area formation of the first optical interference layer are carried out in the same way as described above.

According to an embodiment of the invention, the transparent cover plate consists of a single material, for example glass or plastic, preferably soda-lime glass. Preferably the cover plate is a rigid glass or plastic plate. In this case, the outer or inner surface of the cover plate is formed by the respective material of the cover plate. According to an alternative embodiment, the cover plate consists of at least two different materials, the outer and/or inner surface of the cover plate being formed by a material different from a core of the cover plate. The core of the cover plate is preferably made of a single material, for example glass or plastic, preferably soda-lime glass. A material different from the core of the cover plate, which is transparent and has the same optical refractive index as the material of the core of the cover plate, is applied to the outside and/or inside of the core of the cover plate in this case, the outer and/or inner surface of the cover plate is formed by the respective material applied to the core of the cover plate. According to the invention, the term "cover plate" thus also includes composite bodies, with the proviso that the materials forming the cover plate are transparent and have the same optical refractive index.

For the purpose of the present invention, the term "transparency" or "transparent" refers to a transmission for visible light of at least 80%, in particular at least 90%, preferably at least 95%, in particular 100%. Typically, visible light is present in the wavelength range from 380 nm to 780 nm. The term "opacity" refers to a visible light transmission of less than 5%, in particular 0%. The percentage values refer to the intensity of the light, measured on one side of the cover plate, related to the intensity of the light incident on the other side of the cover plate. For such a measurement, a white light source (source for visible light) can be placed on one side of the cover plate and a detector for visible light on the other side of the cover plate. The following values for the optical refractive index always refer to the optical refractive index in the visible wavelength range from 380 nm to 780 nm.

The optical interference layers can each be single or multi-layered, i.e. have one or more refractive layers. The optical interference layers are used to generate a color, whereby the optical interference layers are configured in such a way that constructive or destructive interference of light reflected at the various interfaces of the optical interference layer is possible. The color results from the interference of the light reflected at the interfaces of the optical interference layer. When illuminated with (white) light, especially sunlight, the optical interference layer acts as a color filter to produce a homogeneous color.

In principle, the optical interference layers can have the same refractive index and layer thickness. According to an advantageous embodiment of the method according to the invention, at least two optical interference layers differ in refractive index and/or layer thickness, which makes it possible to produce a cover plate with a variety of colors.

When illuminated from the outside with white light, especially when illuminated with sunlight, the flat body gives the observer a color impression consisting of at least two colors, i.e. the flat body is multicolored. Preferably, the multicolor color impression extends over the entire outer surface of the flat body or its cover plate.

The color of the flat body can be described by three color coordinates L*, a*, b*, whereby the color coordinates refer to the (CIE) L*a*b* color space known to the expert, in which all perceivable colors are exactly defined. This color space is specified in the European standard EN ISO 11664-4 "Colorimetry—Part 4: CIE 1976 L*a*b* Color space", which is fully referred to in the context of the present description of the invention. In the (CIE) L*a*b* color space, each color is defined by a color locus with the three Cartesian coordinates L*, a*, b*. On the a* axis, green and red are opposite each other, the b* axis runs between blue and yellow, and the L* axis describes the brightness (luminance) of the color. For a more descriptive representation, the quantities can be converted to the Lhc color space, where L remains the same and the saturation is the radius and h the angle of a color point in the a*b* plane.

The colors of the flat body refer to an observation from the outer environment, i.e. in view of the front cover plate. The color measurement or the determination of the color coordinates of the flat body can easily be done by a commercially available colorimeter (spectrophotometer). For this purpose, the color measuring device is directed to the outer surface of the front cover plate, especially to the outer surface. Conventional color measuring instruments allow color measurement in accordance with standards, whereby their embodiment and tolerances are typically subject to international standards, for example defined by DIN 5033, ISO/CTE 10527, ISO 7724 and ASTM E1347 For example, with regard to color measurement, full reference is made to the DIN 5033 standard. A colorimeter has as light source for example a xenon flash lamp, tungsten halogen lamp or one or more LEDs, whereby the outer surface of a body is illuminated with the generated (e.g. white) light and the light received by the flat body is measured. The body color measured by the colorimeter results from the reflected and remitted light of the flat body.

In the case of different embodiments of the method according to the invention or of the cover plate, the outer and/or inner surface of the cover plate each have a structured area or can be provided with such an area. The first optical interference layer and, if necessary, at least one further (second and/or third) optical interference layer can be arranged on the outer and/or inner surface. For example, the outer surface has a structured area, the inner surface does not have a structured area and at least one optical interference layer is formed on part of the inner side of the cover plate. Optionally, at least one further (second) optical interference layer is formed on the inside of the cover plate (in particular also over the first optical interference layer). Optionally, the cover plate has at least one further (third) optical interference layer on the inside of the cover plate (in particular also under the first optical interference layer).

In order to achieve a homogeneous color impression, at least one surface (i.e. outer surface and/or inner surface) of the cover plate has a structured area. Preferably, the structured area extends over the entire surface of the cover plate, i.e. over the entire outer and/or inner surface of the cover plate, so that the flat body has a homogeneous color impression overall.

The term "textured area" or "structured area" covers, in a particularly advantageous way, an area of the outer and/or inner surface of the cover plate in which the characteristics described below are present in combination.

Accordingly, the structured area perpendicular to the plane of the cover plate has a height profile with mountains (elevations) and valleys (depressions), whereby an average height difference between the mountains and valleys is at least 2 µm and preferably, but not necessarily, a maximum of 20% of a thickness of the transparent cover plate. Furthermore, at least 50% of the structured area of the surface (outer and/or inner surface) is composed of differently inclined segments or facets (reflecting areas of the surfaces). The segments are sections of the surface of the cover plate and are each embodied as flat surfaces that are inclined to the plane of the cover plate. At least 20% of the segments have an angle of inclination in the range of more than 0° to a maximum of 15° and at least 30% of the segments have an angle of inclination in the range of more than 15° to a maximum of 45°. Advantageously, but not necessarily, less than 30% of the segments have an angle of inclination greater than 45° The structures are preferably non-periodic and anisotropic. For special optical effects, however, periodic structures and anisotropic structures can be used. Furthermore, the segments are flat and have a segment area of at least 1 pm$^2$. The structured area can be produced, for example, by etching, sandblasting or rolling the cover plate.

The structured area has a large number of flat segments. For the purpose of the present invention, plane segments can be formed by non-curved surfaces. However, it is also possible that plane segments are formed by slightly curved surfaces. A segment is slightly curved in the sense of the present invention if the following applies to each point of the segment: if an (imaginary) tangential plane with an area of 1 µm$^2$ is constructed at a point of the segment, the distance between the area of the segment and the tangential plane, relative to the normal direction to the tangential plane, is less than 50 nm. The configuration of the segments, especially their angle of inclination or mean roughness, does not correspond to a normal distribution, for example.

Furthermore, it is preferable that in at least one zone (i.e. area) of the structured region the segments each have an average roughness of less than 15% of the layer thickness of the at least one optical interference layer. If the optical interference layer consists of several refractive layers, the segments of the at least one zone each have a mean roughness of less than 15% of a layer thickness of the refractive layer with the lowest layer thickness. The zone in which the segments each have a mean roughness of less than 15% of the layer thickness of the optical interference layer can correspond to the structured area, i.e. zone and structured area are then identical.

If a surface has no structuring, it is smooth (within the limits of production inaccuracies).

The structured area can be used to advantageously achieve that when the cover plate is illuminated with light, light with relatively high intensity is reflected even when the observation is outside the gloss angle (angle of incidence of the incident light corresponds to the angle of reflection of the reflected light, relative to the plane of the cover plate). This is caused by the differently inclined segments, which are available in sufficient number, suitable size and suitable roughness as well as suitable angles of inclination to enable a high intensity of the reflected light even when observed outside the gloss angle. There are always a sufficient number of inclined segments that scatter sufficient intensity in directions outside the gloss angle of the cover plate in the case of structuring outside by reflection or refraction at the segments and in the case of structuring inside by reflection at the segments.

As used here and further, the term "gloss angle" refers to the normal to the plane of the cover plate, as opposed to "local gloss angle" which refers to the normal to the plane of a segment. Gloss angle and local gloss angle can be the same (segment is parallel to the plane of the cover plate), but are usually different (segment is inclined to the plane of the cover plate) As a result, the intensity of the light not reflected (i.e. scattered) at the gloss angle is relatively high and, compared to a reflecting surface without such a structured area, has only a small angular dependence with respect to the direction of incidence and observation By means of the optical interference layer, the light reflected outside the gloss angle can be subjected to color selection, depending on the refractive index and layer thickness of the at least one optical interference layer, so that the surface of the cover plate has a homogeneous color with relatively low angle dependence In this respect, the structured area has a height profile with an average height difference between the mountains and valleys of at least 2 μm, preferably at least 10 μm and especially preferably at least 15 μm. Such a structured area can be created by etching the cover plate (e.g. cover glass). In this respect, the structured area has an equally advantageous height profile in which an average height difference between the mountains and valleys is at least 50 m, preferably at least 100 μm, in particular more than 100 μm, more than 150 μm or more than 200 μm. Such a structured area can be created by rolling the cover plate (e.g. cover glass). Accordingly, the invention advantageously extends to a facade element whose at least one structured area of the cover plate is produced by etching or rolling, whereby the said height profiles can be produced. However, the structures can also be produced by applying a transparent and structured layer to the cover plate. The layer must have the same (or at least very similar) refractive index as the cover plate. According to the invention, the structuring of a surface of the cover plate should also include the application of such a transparent and structured layer.

The mentioned properties of the structured area of the cover plate can be determined by conventional measuring instruments, such as a microscope, especially a confocal microscope, or a needle profilometer.

Preferably, the structured area of the cover plate ensures that a brightness L of the reflected light of at least 10 is obtained at observation angles of 45° and 15° (each related to the normal to the plane of the cover plate) and an angle of incidence that deviates by 45° (in both directions) from the respective gloss angle. Preferably, a brightness L of the reflected light of at least 15 and more preferably at least 20 occurs. For this measurement, a black cover is placed on the side of the (uncoated) cover plate that is turned away from the side to be characterized A D65 lamp is used for the measurement and the brightness L is measured with a commercially available multiangle colorimeter (10° aperture angle). The measurement setup is explained in detail below. In this context, full reference is made to the European standard EN ISO 11664-4.

In the case of an advantageous embodiment at least 80%, and preferably at least 90% of a structured area of the outer surface or the inner surface (depending on which surface is structured) is composed of segments inclined to the plane of the cover plate. By increasing the number of segments, the intensity of the light reflected from the structured area of the surface of the cover plate, even outside the gloss angle, and its angular stability can be further increased.

In another advantageous embodiment, at least 30% of the segments of a structured area have an angle of inclination in the range from greater than 0° to a maximum of 15°, at least 40% of the segments have an angle of inclination in the range from greater than 15° to a maximum of 45° and preferably, but not necessarily, less than 10% of the segments have an angle of inclination greater than 45°. Particularly preferred, at least 40% of the segments have an angle of inclination in the range from greater than 0° to maximum 15°, at least 50% of the segments have an angle of inclination in the range from greater than 15° to maximum 45° and preferably, but not necessarily, less than 10% of the segments have an angle of inclination greater than 45°. If there are relatively many facets with a small angle of inclination of less than 15°, essentially only a reflected intensity occurs (as with an unstructured surface) at an observation angle near the gloss angle, which is not desirable according to the invention. With steeper facets, the angular dependence of the reflected light is reduced, but with numerous very steep facets (greater than 45°), multiple reflections can occur with increased intensity, which is disadvantageous because this can lead to a greater coupling of even that portion of the light into the absorber layer whose reflection is desired. In addition, with many coating processes it is difficult to guarantee a conformal coverage with the same layer thickness simultaneously on flat and steep surface segments. The layer thickness of the optical interference layer of an optical interference coating applied to the structured area would therefore depend on the angle of inclination, which in turn leads to undesired angle dependencies. In this respect, an embodiment in which the segments each have an angle of inclination greater than 0° and a maximum of 45° is most preferred. According to the above conditions, a very high intensity of the reflected light can be achieved even outside the gloss angle with a particularly low angular dependence of the intensity.

The structures are preferably non-periodic and anisotropic. For special optical effects, however, periodic structures and/or anisotropic structures can also be used. Periodic and anisotropic structures such as pyramids, tetragonal or hexagonal honeycomb structures or hemispheres can easily be produced by rolling during glass drawing. They can be used for attractive gloss and color effects. If the surface structures meet the above conditions, the flat bodies show a significantly reduced decrease in color for angles outside the gloss angles, but the angle dependencies are then anisotropic with respect to the orientation in the plane of the flat bodies.

Thus a homogeneous color effect with low angle dependence and at the same time high efficiency of a flat body can be reached very satisfactorily. On the one hand, the structured surface of the cover plate reflects light with high intensity and low angle dependence even outside the gloss angle. On the other hand, the filter effect of the at least one optical interference layer enables light with high intensity to be absorbed, so that a large proportion of the incident light can be used with high efficiency or as little loss of efficiency as possible. In addition, a good homogeneous color impression is achieved by the at least one coloring optical interference layer, whereby two different colors can be realized in a simple way by using the mask technique and selective arrangement of the first applied (first) optical interference layer. The optical interference layer acts as a filter with a narrow-band reflection and a wide-band transmission.

Each optical interference layer can contain and especially consist of one or more refractive layers. A refractive layer consists of the same material (with the same composition) and has a homogeneous (same) refractive index, especially across the layer thickness. If an optical interference layer contains several refractive layers, at least two refractive layers consist of a different material and have a different refractive index. Advantageously, at least one refractive layer has a refractive index n of greater than 1.7, preferably greater than 2.0 and especially preferably greater than 2.3. In principle, the higher the refractive index, the lower the angular dependence of the reflected light, so that the angular dependence of the color impression can be further reduced.

Advantageously, the at least one optical interference layer contains at least one compound selected from $TiO_x$, $ZrO_x$, SiC and $Si_3N_4$. If the optical interference layer has two, three or more layers, the optical interference layer preferably contains at least one compound selected from $MgF_2$, $Al_2O_3$, $SiO_2$ and silicon oxynitride. These are compounds with a relatively low refractive index.

Due to the combination of a structured surface with at least one optical interference layer, which has only a small number of refractive layers (e.g. one to three refractive layers), a good color impression can already be achieved. Due to the low number of refractive layers, the production is simplified and production costs are reduced.

Advantageously, at least one optical interference layer (in particular all optical interference layers) contains (or consists of) exactly one refractive layer whose refractive index n is greater than 1.9, preferably greater than 2.3.

Equally advantageously, at least one optical interference layer (in particular all optical interference layers) contains exactly two refractive layers (or consists of these), wherein a first refractive layer with a first refractive index n1 is present on the cover plate with a refractive index nd and a second refractive layer with a second refractive index n2 is present on the first refractive layer. The following applies to the absolute values of the differences in the refractive indices: $|n1-nd|>0.3$ and $|n2-n1|>0.3$ and at least one of the refractive indices n1 or n2 is greater than 1.9, preferably greater than 2.3.

Similarly advantageously, at least one optical interference layer (in particular all optical interference layers) contains exactly three refractive layers (or consists of these), wherein a first refractive layer with a first refractive index n1 is present on the cover plate with a refractive index nd, a second refractive layer with a second refractive index n2 is present on the first refractive layer and a third refractive layer with a third refractive index n3 is present on the second refractive layer. For the absolute values of the differences of the refractive indices the following applies: $|n3-n2|>0.3$ and $|n2-n1|>0.3$ and $|n1-nd|>0.3$, whereby the values of the refractive indices are alternating: either n1>n2 and n3>n2 or n1<n2 and n3<n2. Furthermore, at least one of the refractive indices n1, n2 or n3 is greater than 1.9, preferably greater than 2.3.

An optical interference layer with exactly one, exactly two or exactly three refractive layers can be used to achieve a homogeneous color impression of the flat body with simplified production and lower production costs of the flat body. By using two or three refractive layers, the color strength, i.e. brightness and saturation, i.e. the reflection in a certain narrow wave range can be increased. Relatively high refractive indices reduce the angle dependence. Interference layers from layer stacks with more than three layers in combination with the structured cover plate and the embodiments shown are also within the scope of the invention, but are more complex to produce. With a quadruple layer of refractive layers with alternating high and low refractive indices, for example, the bandwidth of the reflected light can be reduced even further with improved transmission.

In the structured area of the cover plate, reflection of the incident light radiation occurs with relatively high intensity even outside the gloss angle. For this purpose, the structured area is preferably configured in such a way that a reflection haze of more than 50%, and preferably more than 90%, is present. The reflection-haze can be determined by a commercially available haze measuring instrument. According to ASTM D1003, haze is the ratio of the diffuse portion of reflected light to total reflection.

In the structured surface, at least one zone is provided in which the segments have an average roughness of less than 15% of the layer thickness of the at least one optical interference layer, thus allowing constructive or destructive interference of the reflected light. Advantageously, this zone extends over the entire cover plate. According to one embodiment, the structured area has at least one further zone, i.e. (partial-) area, in which the segments each have such a mean roughness that interference does not occur at the optical interference layer. For example, the segments there have a mean roughness of 50% to 100% of the layer thickness of the at least one optical interference layer. In these zones, no color is produced by the optical interference layer.

The invention further extends to a method for manufacturing a flat body, which comprises the method according to the invention for processing a transparent cover plate for a flat body.

The invention further extends to a transparent cover plate for a flat body, which is advantageously, but not necessarily, produced by the method described above.

The transparent cover plate has an outer side which is intended to face the external environment and an opposite inner side, wherein at least one cover plate surface, selected from outer and inner surfaces, has a structured area with a light-scattering structure. At least one (first) optical interference layer for reflecting light within a predetermined wavelength range is arranged on a cover plate surface selected from outer surface and inner surface. Here the (first) optical interference layer is arranged over a first area of the cover plate surface of the cover plate side and is not arranged over a second area of the cover plate surface of the cover plate side, the first area and the second area being arranged in perpendicular view through the cover plate in overlap to the structured area.

In an advantageous embodiment of the transparent cover plate, this has at least one further (second and/or third) optical interference layer on the selected cover plate side, the (second and/or third) optical interference layer covering the first area and the second area of the cover plate surface of the selected cover plate side when viewed vertically through the cover plate. Here at least one further (second and/or third) optical interference layer is located on one or both sides of the partially applied optical interference layer.

In another advantageous embodiment of the transparent cover plate, this has at least one further (third) optical interference layer on the non-selected cover plate side, the (third) optical interference layer overlaps the first area and the second area of the cover plate surface of the selected cover plate side when viewed vertically through the cover plate.

The above explanations in connection with the method for processing a transparent cover plate apply equally to the transparent cover plate itself. In order to avoid unnecessary repetition, reference is made to the explanations there.

The invention further extends to a flat body which has a transparent cover plate according to the invention. The flat body is in particular a light-absorbing flat body, such as a solar module for photovoltaic energy generation or a solar collector for energy conversion. The light-absorbing flat body can be used, for example, as an integrated component of a building envelope or free-standing wall, for example as a window, facade or roof element. The flat body can also be a passive flat body, which only serves as an integrated component of a building envelope or free-standing wall. The invention further extends to the use of a flat body according to the invention as an integral part of a building envelope or free-standing wall, in particular as a window, facade or roof element. The flat body can be an active or passive flat body. The flat body is suitable and intended to be installed as a visible flat component in the building envelope or free-standing wall, in particular in a facade, whereby the flat body is part of an external surface which can be viewed from the external environment. The flat body can be integrated as an independent component, whereby the outer surface of the flat body is part of the outer surface of the building envelope or free-standing wall.

The different embodiments of the invention can be realized individually or in any combination. In particular, the features mentioned above and explained below can be used not only in the combinations indicated, but also in other combinations or alone, without leaving the scope of the present invention.

BRIEF DESCRIPTION OF THE DRAWINGS

The invention is explained in more detail below, with reference to the attached drawings which show in a simplified, non-scaled representation:

FIGS. 11-14 schematic representations of exemplary light paths when reflected in the structured area, FIG. 15 a schematic representation of the interference of light beams in an optical interference layer;

FIG. 18 a schematic representation of the measuring method for multi-angle color measurement.

LIST OF REFERENCE CHARACTERS

Figure 1:
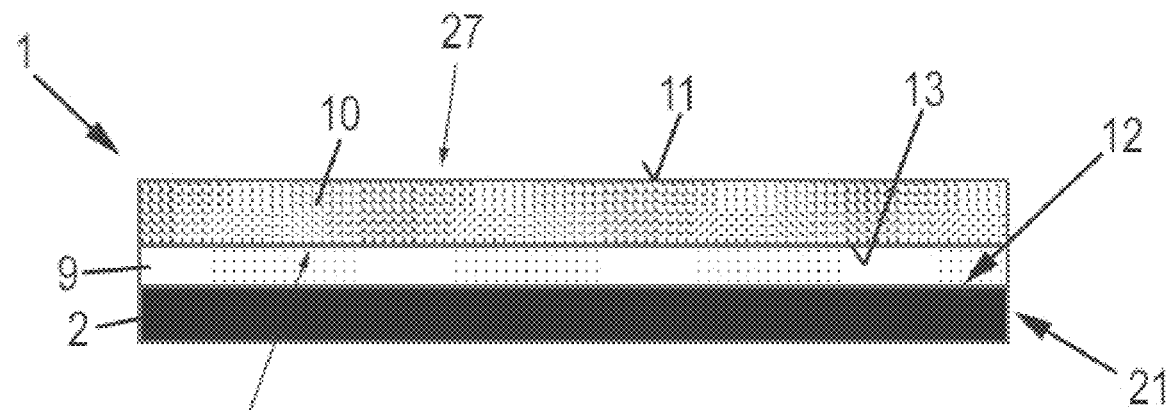
FIGS. 1-4 the basic structure of various embodiments of the flat body according to the invention in schematic cross-sectional views, FIGS. 5-6 schematic cross-sectional views of various embodiments of the cover plate of the flat body of the invention, FIG. 7A-7F schematic cross-sectional views of the production of the cover plate of the flat body according to the invention, FIG. 8 a flow chart to illustrate the method steps as they are carried out in the production of the cover plate according to FIGS. 7A-7F, FIG. 9 a perspective view of a flat body.

1 Flat body
2 Substrate
3 Layer structure
4 Sunlight
5 Back electrode layer
6 Absorber layer
7 Buffer layer
8 Front electrode layer
9 Adhesive layer
10 Cover plate
11 Outer surface
12 Solar cell
13 Inner surface
14 Module rear side
15 Structured area
16, 16' Optical interference layer
17 Segment
19 Opaque coating
20 Multi-angle colorimeter
21 Rear side element
22 First area
23 Second area
24 Mask
25 First zone
26 Second zone
27 Outer side
28 Inner side

DETAILED DESCRIPTION OF THE EMBODIMENTS

In FIG. 1, a flat body according to the invention as a whole denoted with the reference number 1 is schematically illustrated in a cross-sectional view In this case, the flat body 1 is, for example, in the form of a solar module with a composite pane structure. The cross-sectional view is perpendicular to the module surface. The flat body 1 comprises a cover plate 10 (e.g. front glass) and a substrate 2 on the back, which are firmly connected to each other by an adhesive layer 9 (e.g. lamination foil). Solar cells 12 (silicon wafer or thin film solar cells) are located on the substrate 2. The coloring element for the flat body 1 is the coated cover plate 10, whose outer surface 11 faces against the incident light and whose inner surface 13 is connected to the solar cells 12 via the adhesive layer 9. The outer surface 11 of the cover plate 10 is located on its outer side 27, the inner surface 13 on its inner side 28. The substrate 2 with solar cells 12 forms an opaque rear side element 21, whose inherent color is essentially determined by the solar cells 12. In the edge areas and between the solar cells 12, however, the color can also be determined by contacting strips and edge sealing or, in the case of wafer solar cells, by the back foil.

The cover plate 10 here is a glass pane with the lowest possible absorption and consists, for example, of soda lime glass. The outer surface 11 and/or the inner surface 13 of the cover plate 10 are structured (e.g. by etching, sandblasting or rolling during the drawing method) and in addition, outer surface 11 and/or inner surface 13 have at least one optical interference layer, which is not shown in FIG. 2 and is explained in more detail below (see FIGS. 5 and 6). The flat body 1 can be used as an integrated part of a building envelope or free-standing wall, especially as a facade element.

Figure 2:
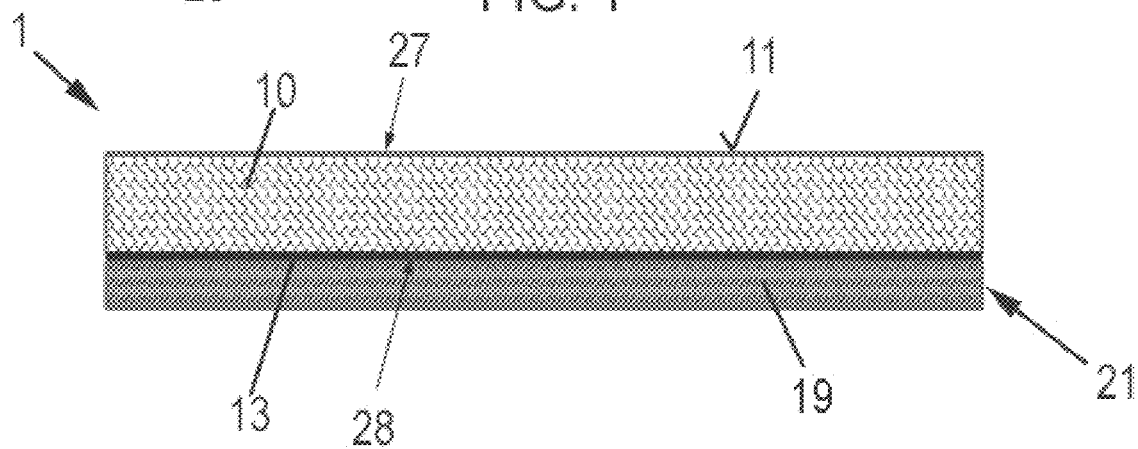

FIG. 2 shows an exemplary structure of a passive flat body 1, which is to be used as an integrated component of a building envelope or free-standing wall, in particular as a facade element, and only fulfils a structural function. The flat body 1 comprises a transparent cover plate 10 and an opaque rear side element 21. The cover plate 10 is configured as in FIG. 1. The above embodiments apply analogously. It would also be possible to configure the cover plate 10 itself as a composite body, whereby it consists of a transparent core embedded in another transparent material (e.g. sandwich-like), which has the same optical refractive index as the core. The outer surface 11 and inner surface 13 are then formed by this material. This is not shown in FIG. 2. The rear side element 21 is here, for example, in the form of an opaque coating 19 of the inner surface 13, which extends over the entire inner surface 13. The opaque coating 19 can consist of one or more layers. As coating, for example, lacquers, polymer layers, polymer films or inorganic layers of metal oxide powders, carbon or semiconductor materials can be used. The layer thickness of the rear side element 21 can be freely selected as long as the desired optical properties of the coating are guaranteed. If necessary, the rear side element 21 can be protected from environmental influences by a rear side cover, for example in the form of a further coating or film. In its embodiment as a coating, the rear side element 21 is non-load-bearing, so that the cover plate 10 has to meet the specific requirements for use as a facade element. In particular, the mechanical load-bearing capacity and the possibility of a suitable connection to the building structure must be ensured, for example by using frames, clamps or rear side rails. For this purpose, the cover plate 10 preferably consists of refined glass, such as thermally tempered glass, toughened safety glass (ESG), or partially tempered glass (TVG). The coating is opaque and can, for example, have a pre-defined color, so that the background color of the coating can create an overall color impression of the flat body 1 in the desired manner. It is equally possible for the rear side element 21 to be achromatic, dark and matt for this purpose.

Figure 3:
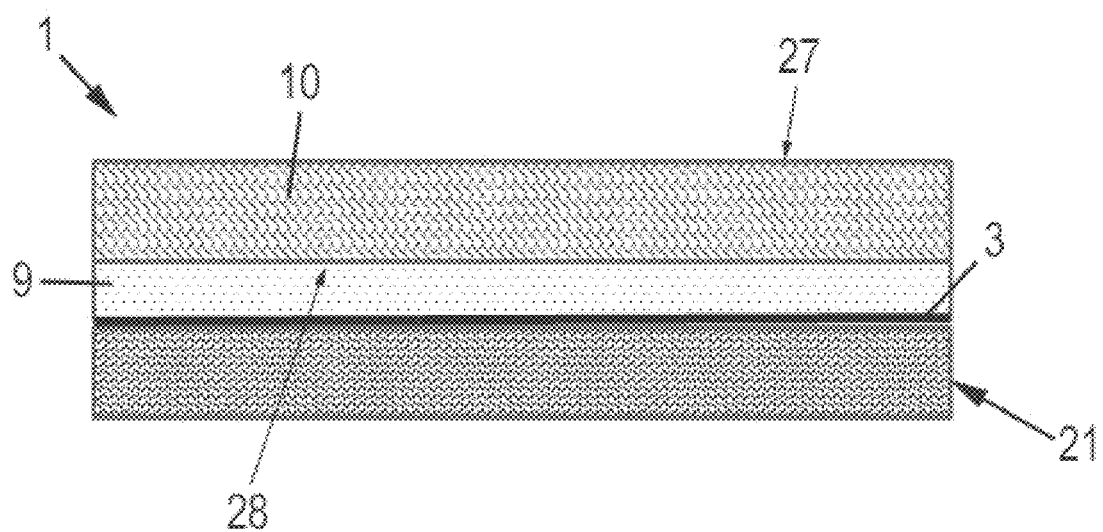

FIG. 3 illustrates a variant of the passive flat body 1 of FIG. 2, according to which the rear side element 21 is an independent body with a defined spatial shape, which is firmly connected to the inner surface 13 of the cover plate 10 here, for example, by means of a transparent adhesive layer 9 (e.g. laminating foil). In principle, any suitable joining technique can be used to firmly connect the cover plate and rear side element 21, e.g. gluing or potting Advantageous are joining techniques where the transparent material used for joining (e.g. adhesive layer, laminating foil or potting material) has a refractive index of greater than 1.4 and less than 1.6. Otherwise, the resulting color of the flat body 1 may be changed in an undesired way. For example, the rear side element 21 is configured in the form of a flat plate, which forms a composite body with the cover plate 10. The rear side element 21 is preferably load-bearing and has suitable mechanical properties for this purpose in order to ensure the load-bearing capacity of the flat body 1 either by itself or in combination with the cover plate 10. The flat body 1 created in this way can be easily connected to a building as a facade element and must meet the overall requirements as a facade element in a building envelope. The rear side element 21, for example, consists of a fiber composite material, glass, stone, metal or ceramic and can be coated in particular with a paint, for example a ceramic screen printing ink or organic glass paint or a suitable inorganic thin film, to provide a desired background color. It is also possible that the material of the rear side element 21 itself already has a desired color. For example, the rear side element 21 consists of a glass colored in the glass matrix. It is also possible to use CIGS thin-films, which are a waste product from the series production of thin-film solar modules, to achieve a particularly homogeneous color impression of a facade in combination with CIGS thin-film solar modules used as facade elements. The layer structure 3 for the solar cells 12 has no power generating function. A glass rear side element 21 can be easily connected to a glass cover plate 10 using conventional lamination methods. For example, the rear side element 21 is a metal plate, a metal foil or consists of a metal composite material. The metal plate or foil can be treated, for example, by anodizing or coating to produce the desired optical properties. The rear side element 21 can equally consist of building materials suitable for outdoor use, for example fiber cement plates, concrete plates, textile-reinforced or fiber-reinforced concrete shells, wood/wood fiber materials, plastics or other non-metallic composite materials. The surface of the material can be configured with the appropriate coloring technology to achieve the desired optical properties. The cover plate 10 is configured as in FIG. 1. The above embodiments apply analogously.

Figure 4:
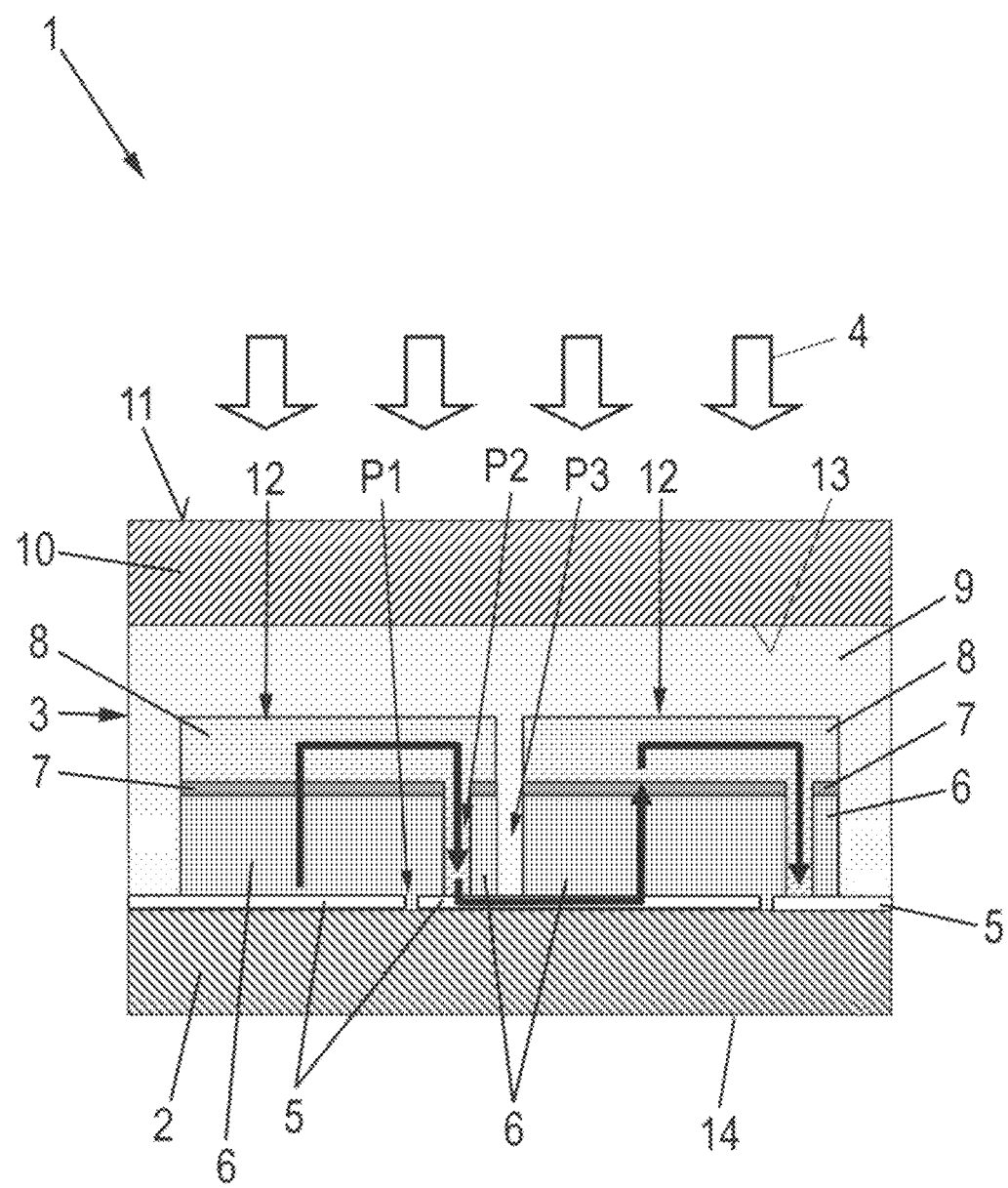

With reference to FIG. 4, the exemplary structure of a thin-film solar module is explained in more detail in FIG. 1 The flat body 1 in the form of a thin-film solar module comprises a plurality of solar cells 12 which are serially interconnected in an integrated form, of which only two are shown in a simplified form. It goes without saying that in the flat body 1 there is usually a large number of solar cells 12 (for example approx. 100-150) connected in series. The flat body 1 has a composite pane structure in substrate configuration. It comprises the backside substrate 2 with a layer structure 3 of thin films applied to it, whereby the layer structure 3 is arranged on a light-entry side surface of the substrate 2. The substrate 2 is here, for example, configured as a rigid, flat glass plate with a relatively high light transmittance, whereby other electrically insulating materials with the desired strength and inert behavior towards the method steps performed can be used equally well. The layer structure 3 comprises an opaque back electrode layer 5 arranged on the surface of the substrate 2, which for example consists of an opaque metal such as molybdenum (Mo) and was applied to the substrate 2 by vapor deposition or magnetic field-assisted cathode sputtering. The back electrode layer 5, for example, has a layer thickness in the range of 300 nm to 600 nm. On the back electrode layer 5, a photovoltaic active (opaque) absorber layer 6 is deposited, which consists of a semiconductor whose band gap is capable of absorbing as much sunlight as possible. The absorber layer 6, for example, consists of a conductive chalcopyrite semiconductor, for example a compound of the group $Cu(In/Ga)(S/Se)$?, especially sodium (Na)-doped $Cu(In/Ga)(S/Se)_2$. In the above formula, indium (In) and gallium (Ga) as well as sulfur (S) and selenium (Se) may be present optionally or in combination. The absorber layer 6 has a layer thickness which is, for example, in the range of 1-5 μm and is in particular about 2 μm. For the production of the absorber layer 6, different layers of material are typically applied, e.g. by sputtering, which are then thermally converted into the compound semiconductor by heating in a furnace, if necessary in an S- and/or Se containing atmosphere (RTP=Rapid Thermal Processing). Experts are well acquainted with this method of manufacturing a compound semiconductor, so it is not necessary to go into it in detail here. A buffer layer 7 is deposited on the absorber layer 6, which in this case consists of a single layer of cadmium sulfide (CdS), indium sulfide ($In_xS_y$) or zinc oxysulfide (ZnOS) and optionally a single layer of intrinsic zinc oxide (i-ZnO) or zinc magnesium oxide (ZnMgO), which is not shown in FIG. 1. A front electrode layer 8 is applied to the buffer layer 7, for example by sputtering. The front electrode layer 8 is transparent for radiation in the visible spectral range ("window electrode"), so that the incident sunlight 4 (illustrated by arrows in FIG. 1) is only slightly attenuated. The front electrode layer 8, for example, is based on a doped metal oxide, for example n-conducting aluminum (Al)-doped zinc oxide (ZnO). Such a front electrode layer 8 is generally referred to as TCO layer (TCO=Transparent Conductive Oxide) The layer thickness of the front electrode layer 8, for example, is about 1000 nm Together with the buffer layer 7 and the absorber layer 6, the front electrode layer 8 forms a heterojunction (i.e. a sequence of layers of the opposite conductivity type). The buffer layer 7 can cause an electronic matching between the absorber layer 6 and the front electrode layer 8. To protect against environmental influences, the (plastic) adhesive layer 9 is applied to the layer structure 3 and serves to encapsulate the layer structure 3. Bonded to the adhesive layer 9 is the sunlight-transparent front or light-entry side cover plate 10, which in this case, for example, takes the form of a rigid (flat) glass plate made of extra-white glass with low iron content. The cover plate 10 is used for sealing and mechanical protection of the layer structure 3. The cover plate 10 has the inner surface 13 facing the solar cells 12 and the outer surface 11 facing away from the solar cells 12, which is also the module surface or module top side. Via the outer surface 11, the thin-film solar module can absorb sunlight 4 to generate an electrical voltage at resulting voltage connections (+,−). A current path is illustrated in FIG. 4 by serially arranged arrows. The cover plate 10 and the substrate 2 are firmly connected ("laminated") to each other by the adhesive layer 9, whereby the adhesive layer 9 here, for example, is formed as a thermoplastic adhesive layer that becomes plastically deformable when heated and firmly connects the cover plate 10 and the substrate 2 to each other when cooled. The adhesive layer 9 can be provided in the production method as a laminating film and consists here, for example, of PVB. The cover plate 10 and the substrate 2 with the solar cells 12 embedded in the adhesive layer 9 together form a laminated composite. The module rear side 14 is given by the surface of substrate 2 facing away from the solar cells 12.

For the formation and series connection of the solar cells 12, the layer structure 3 is structured using a suitable structuring technology, for example laser writing and/or mechanical ablation. For this purpose, it is common practice to insert direct sequences of three structuring lines P1-P2-P3 each into the layer structure (stack) 3. Here, at least the back electrode layer 5 is subdivided by first structuring lines P1, thus creating the back electrodes of the solar cells 12 Second structuring lines P2 are used to divide at least the absorber layer 6, thus creating the photovoltaic active areas (absorbers) of the solar cells 12. Third patterning lines P3 divide at least the front electrode layer 8, creating the front electrodes of the solar cells 12. By means of the second structuring line P2, the front electrode of a solar cell 12 is electrically connected to the back electrode of an adjacent solar cell 12, whereby the front electrode contacts the back electrode directly, for example. In the example of FIG. 4, the trenches of the first structuring lines P1 are filled by material of the absorber layer 6. The trenches of the second structuring lines P2 are filled by material of the front electrode layer 8 and the trenches of the third structuring lines P3 are filled by the adhesive layer 9. Each direct sequence of first, second and third structuring lines P1-P2-P3 forms a structuring zone for series connection of two immediately adjacent solar cells 12. The invention also covers solar modules based on silicon wafer cells and any other technology for the production of solar cells.

Figure 5:
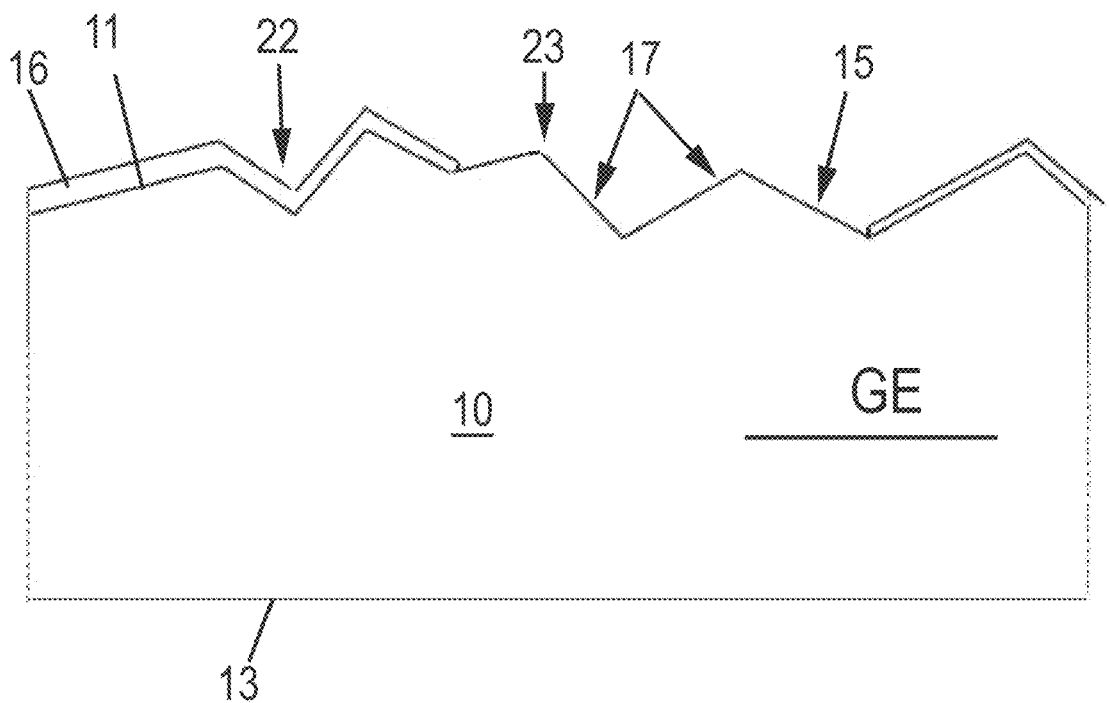

FIG. 5 shows an enlarged section of the cover plate 10 of the flat body 1 illustrated in FIGS. 1 to 4. The outer surface 11 of the cover plate 10 is structured in an area 15, which in this example covers the complete outer surface 11, i.e. outer surface 11 and structured area 15 are identical. The inner surface 13 is not structured Directly on the outer surface 11, a first optical interference layer 16 is partially arranged. In the structured area 15, the outer surface 11 has a height profile with mountains and valleys. More than 50% of the outer surface 11 consists of flat segments 17, whose planes are each inclined to the plane of the cover plate 10, i.e. have an angle different from zero. A mean height sublayer between the highest points (peaks) and lowest points (valleys) of the outer surface 11 is at least 5 μm and, for example, a maximum of 20% of the thickness of the transparent cover plate 10. Relative to the plane of the cover plate 10, at least 20% of the segments 17 have an angle of inclination in the range from greater than 0° to a maximum of 15°, at least 3 0° % of the segments have an angle of inclination in the range from greater than 15° to a maximum of 45° and less than 30% of the seg-merits 17 have an angle of inclination greater than 45°. In the example of FIG. 3, all segments have a maximum tilt angle of 45°.

The first optical interference layer 16 is thin and has a layer thickness in the range of 0.1 to several (e.g. 5) micrometers. In addition, the first optical interference layer 16 has a refractive index of greater than 1.7, preferably greater than 2.0 and especially preferred greater than 2.3, as well as the lowest possible absorption in relation to the incident light. The first optical interference layer 16 can be single or multi-layered, i.e. consist of one or more refractive layers. Each refractive layer has a specific refractive index and consists of the same material. For example, the optical interference layer 16 consists of MgO, $SiON_x$, $Si_3N_4$, $ZrO_2$, $TiO_x$ and/or SiC. The electrical conductivity of the individual refractive layers, especially of the first optical interference layer 16, should be as low as possible. The first optical interference layer 16 does not cover the outer surface 11 completely, but only partially. Specifically, the outer surface 11 is composed of a first area 22 covered by the first optical interference layer 16 and a second area 23 not covered by the first optical interference layer 16. In particular, the first optical interference layer 16 can extend over and completely cover the entire outer surface 11, with the exception of the second area 23.

The second area 23 and the first area 22 overlap with the structured area 15 when viewed vertically through the cover plate 10, i.e as seen in a vertical projection (vertical extension) of the structured area 15 onto an (imaginary) surface parallel to the plane GE of the cover plate 10, and as seen in a vertical projection (vertical extension) of the second area 23 and the first area 22, respectively, on the same surface of the cover plate 10, the first area 23 and the second area 22 overlap and are advantageously located within the structured area 15. For example, the surface parallel to the plane GE is the inner surface 13.

FIG. 5 shows an example of the plane GE of cover plate 10. The plane GE results from the essentially planar shape of the cover plate 10. The drawn plane GE is only exemplary and may have a different position. In this example, where the inner surface 13 is not structured, the plane GE is parallel to the inner surface 13. With respect to the structured outer surface 11, the plane GE is parallel to an imaginary surface of the outer surface 11 created by averaging the segments 17.

In the first area 22 of the outer surface 11, which is covered by the first optical interference layer 16, a filtered reflection of light rays within a given or predeterminable wavelength range occurs, which is explained in more detail below. In the second area 23 of the outer surface 11 not covered by the first optical interference layer 16, essentially no such filtered reflection occurs. A color effect by the optical interference layer 16 is therefore only present in the first area 22 of the outer surface 11. In any case, there is a contrast.

Figure 6:
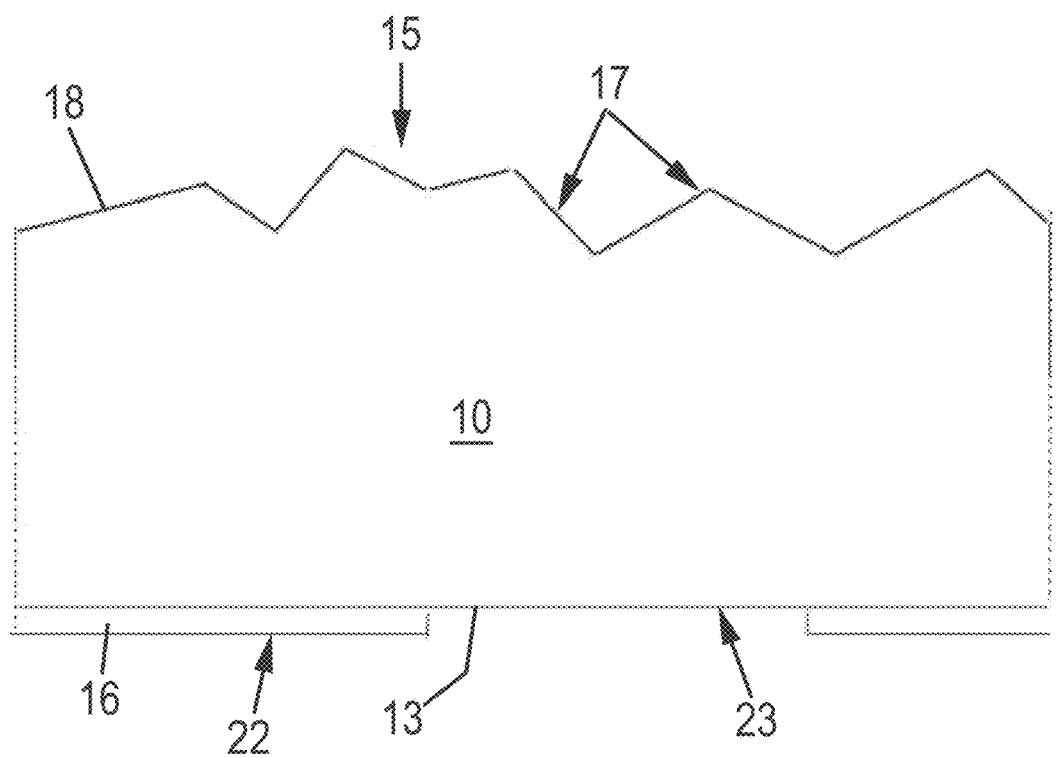

FIG. 6 shows a variant of the cover plate 10 of FIG. 5. To avoid unnecessary repetition, only the differences to FIG. 5 are explained and otherwise reference is made to the explanations in FIG. 5. Accordingly, the first optical interference layer 16 is not located on the outer surface 11 of the cover plate 10, but only on the unstructured inner surface 13 of the cover plate 10. Analogous to FIG. 5, the inner surface 13 has a first area 22 covered by the first optical interference layer 16 and a second area 23 not covered by the first optical interference layer 16.

Figure 8:
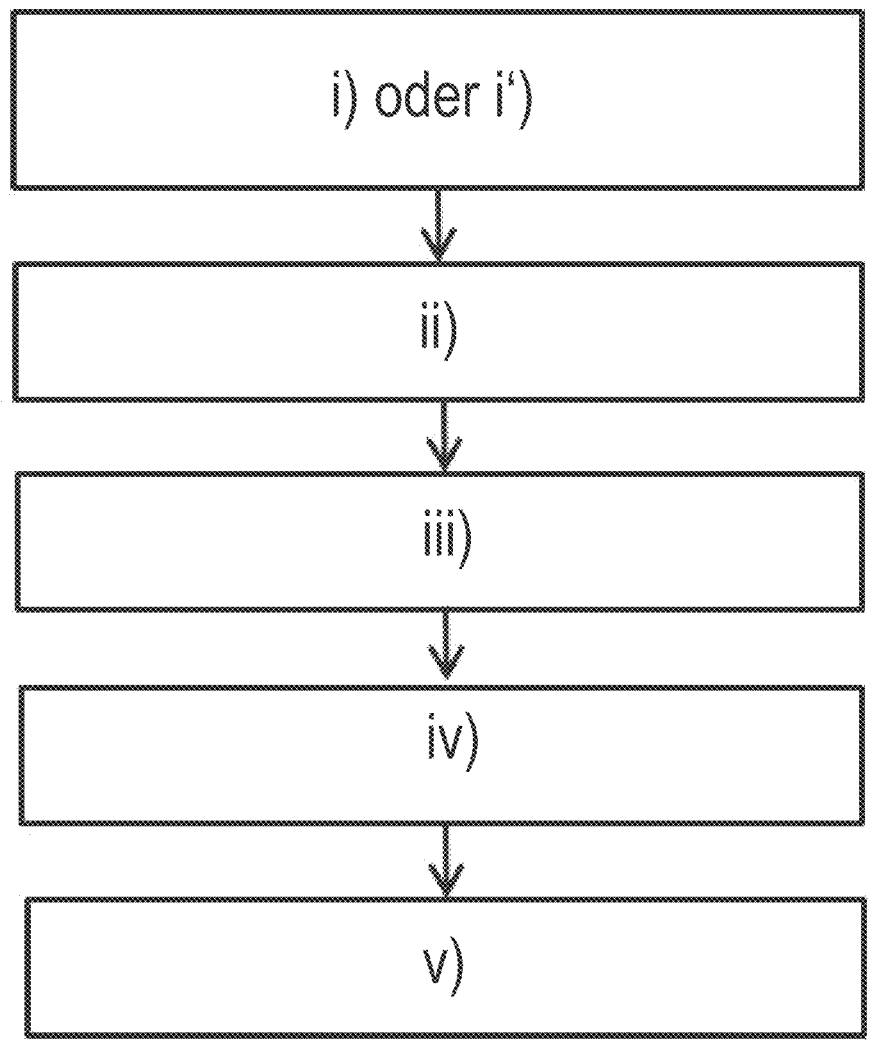

Reference is now made to FIGS. 7A-7F, where a schematic cross-sectional view illustrates an exemplary production of the cover plate 10 of FIG. 6. Accordingly, the outer surface 11 is structured and the inner surface 13 is not structured. The optical interference layer 16 is only applied to the inner surface 13. The intermediate stages of the cover plate 10 during its manufacture are illustrated. For the sake of simplicity, the structuring of the outer surface 11 has been omitted. FIG. 8 also shows a flow chart of the successive steps performed in this method.

Step i):
According to a first alternative, a transparent cover plate 10 (front glass) is provided, which already has a structured area 15 on the outer surface 11 (FIG. 7A).

Step i'):
According to a second alternative, a non-structured transparent cover plate 10 is provided, which is provided with a structured area 15 after provision. The method thus comprises providing a non-structured transparent cover plate 10 with an outer surface 11 intended to face an external environment and an opposite inner surface 13, and forming a structured area 15 with a light-scattering structure in at least one surface selected from outer and inner surfaces (FIG. 7A).

In the present case, the formation of the structured area 15 can take place at any time, since the first optical interference layer 16 and the structured area 15 are located on different surfaces of the cover plate 10. In the variant of FIG. 5, it would be necessary to form the structured area 15 already before applying mask 24.

It goes without saying that a cover plate 10, which already has a structured area 15, can be provided with a structured area 15 again after provision. In the first alternative according to step i), the formation of a structured area 15 with a light-scattering structure in at least one surface selected from the outer and inner surface can be provided as an option.

Step ii):
Subsequently, a mask 24 is applied to part of the inner surface 13 of the cover plate 10. The mask 24 does not cover a first area 22 of the inner surface 13, but covers a second area 23 of the inner surface 13. The second area 23, preferably the complete second area 23, has an overlap with the structured area 15 when viewed vertically through the cover plate 10 (FIG. 7B).

Step iii):
Subsequently, a (first) optical interference layer 16 for reflecting light within a given wavelength range is applied to the inner surface 13, which is partially covered by the mask 24. The optical interference layer 16 is applied to the mask 24 and at least partially to the first area 22 of the inner surface 13 not covered by the mask 24 (FIG. 7C).

Step iv):
Subsequently, the mask 24 is removed, whereby the optical interference layer 16 applied to the mask 24 is also removed (FIG. 7D).

By following steps i) to iv) above, a cover plate 10 with the configuration of FIG. 6 can be produced.

According to a particularly preferred embodiment of the method, a further step v) is optionally carried out:

Step v)
Here, at least one further optical interference layer 16' for reflecting light within a specified wavelength range is applied to the second area 23 of the inner surface 13 and at least partially, in particular completely, to the already applied optical interference layer 16. The cover plate 10 thus formed is illustrated in FIG. 7E.

The first optical interference layer 16 applied only partially in the first area 22 leads to a local color effect of the cover plate 10, corresponding to the reflection of light within a given wavelength range of the optical interference layer 16. In the installed state of the cover plate 10, the color of the flat body 1 in the first area 22 results from a combination of the color conditioned by the first optical reflection layer 16 and the background color of the rear side element 21.

In the embodiments of FIGS. 5 and 6, there is no first optical interference layer 16 in the second area 23. In the installed state of the cover plate 10, the local color effect in the second area 23 is mainly due to the background color of the rear side element 21, whose color can be seen through the transparent cover plate 10.

In the embodiment of FIG. 7E, the second area 23 contains the additional (second) optical interference layer 16'. In the first area 22 the two optical interference layers 16, 16' are superimposed. In the installed state of the cover plate 10, the color of the flat body 1 in the second area 23 results from a combination of the color caused by the optical reflection layer 16' and the background color of the rear side element 21. In the first area 22, the color results from a combination of the color caused by the two optical reflection layers 16, 16' superimposed on each other and the background color of the rear side element 21.

As illustrated in FIG. 7F, the cover plate 10 may have at least one additional (third) optical interference layer 16", which may in particular be applied to the outer surface 11 and/or inner surface 13 over the entire surface. The third optical interference layer 16" is applied to the first area 22 and the second area 23 of the inner surface 13. The third optical interference layer 16" can be provided as an alternative or supplement to the second optical interference layer 16'.

Figure 9:
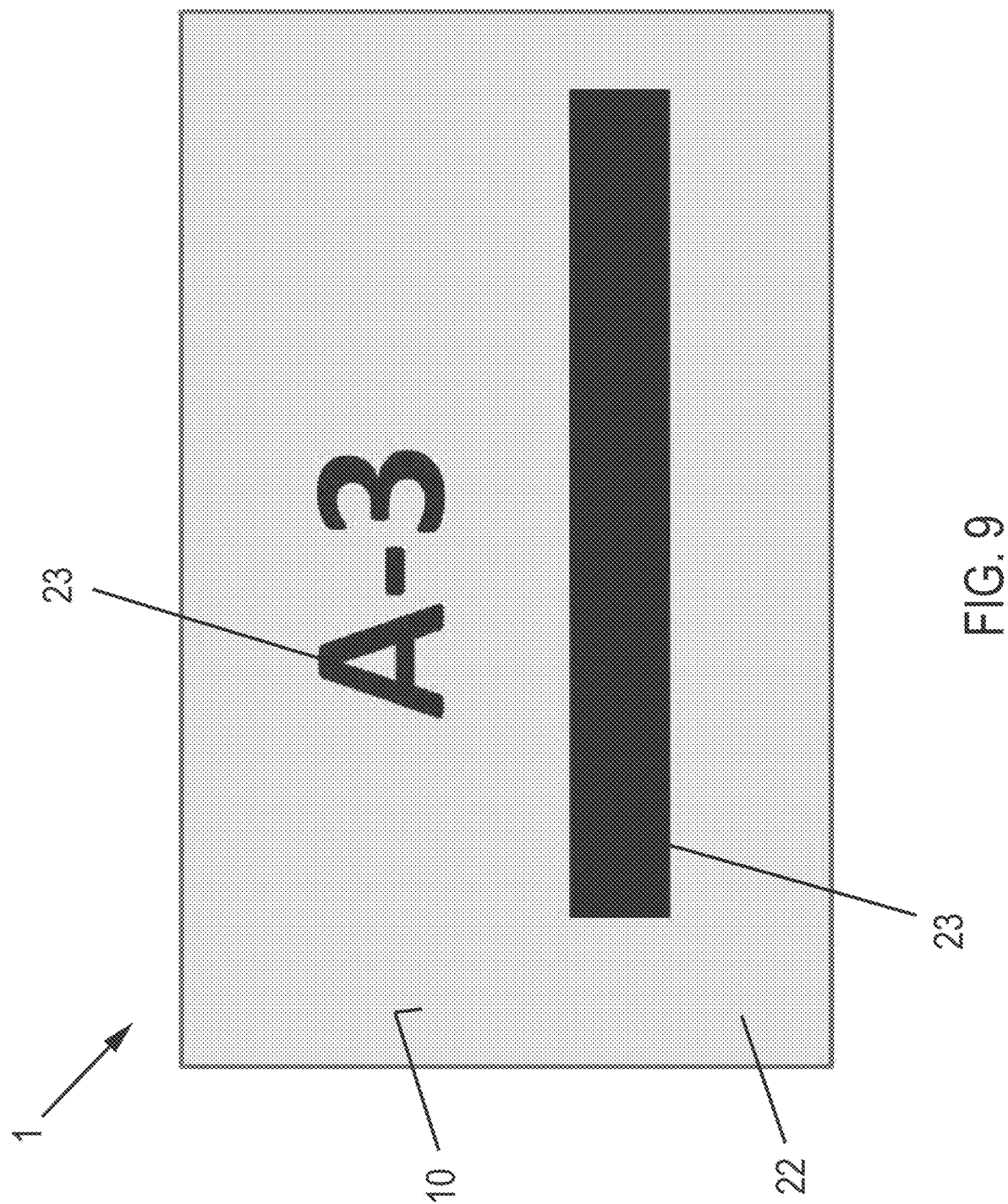

As shown in FIG. 9 by means of a view of the flat body 1 with cover plate 10, the surface of flat body 1 can have two colors in all embodiments. This allows patterns (here: bars) or characters (here: "A-3") that encode information, especially text, to be set off against a background of a different color. In FIG. 9, the viewer looks at the cover plate 10 from above.

In the embodiments of the cover plate 10 of FIGS. 5 and 6, a first color in the first area 22 results from a combination of the color effect of the optical interference layer 16 and the background color of the rear side element 21 and a second color in the second area 23 results from the background color of the rear side element 21. The color in the first area 22 can be freely selected. When configuring the cover plate 10 of FIG. 7E, a first color in the first area 22 results from a combination of the color effect of the two optical interference layers 16, 16' and the background color of the rear side element 21 and a second color in the second area 23 results from a combination of the color effect of the optical interference layer 16' applied later and the background color of the rear side element 21. Both the first color in the first area 22 and the second color in the second area 23 are selectable within a large color space within the limits of the physical degrees of freedom (layer thicknesses, refractive indices). In FIG. 9, the patterns and characters correspond to the second area 23 and the differently colored background corresponds to the first area 22, but it is equally possible that the patterns and characters correspond to the first area 22 and the differently colored background corresponds to the second area 23.

Figure 10:
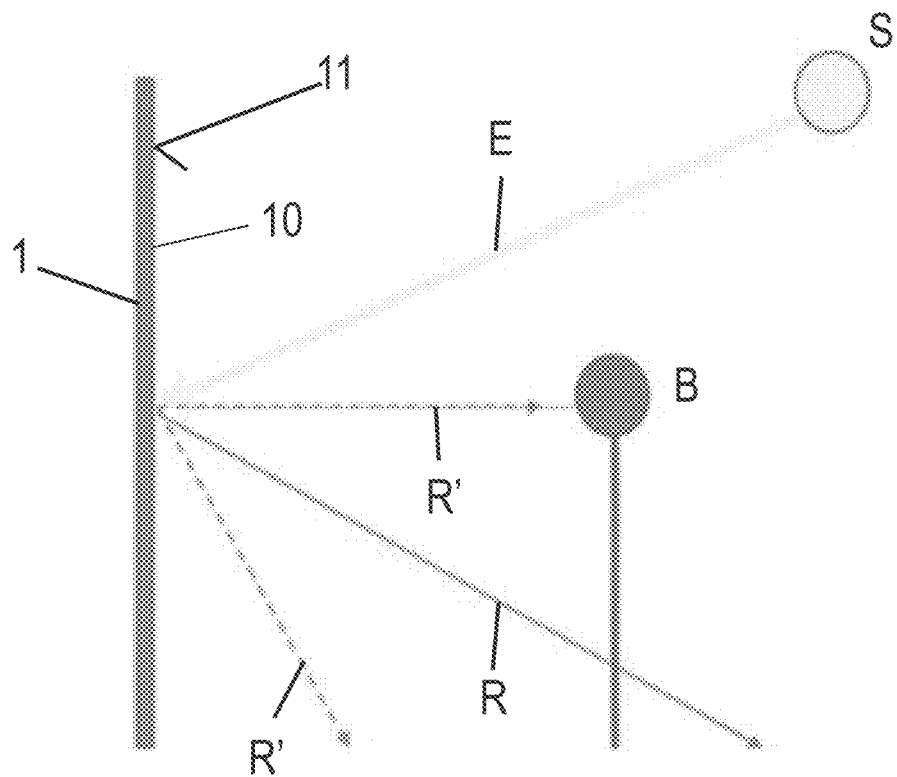
FIG. 10 a schematic representation of typical light conditions on a flat body.

In the following, the function of the structuring of the outer surface 11 of the cover plate 10 is described in detail. First, consider FIG. 10, which illustrates typical lighting conditions for a flat body 1 configured as a facade element According to this, light from the sun S hits the cover plate 10 directly and is reflected at the gloss angle (angle of incidence=angle of reflection, relative to the surface normal of the plane of the cover plate). The incident light beam E and the light beam R reflected at the gloss angle are shown. In addition to the reflected light beam R, the incident light is also diffusely scattered outside the gloss angle due to the configuration according to the invention of at least one structured side inside or outside and the interference layer on the inside. Two diffusely scattered light beams R' are shown as examples. The color effect results from reflection, scattering and interference. If an observer B stands in front of the flat body 1 and looks vertically at the cover plate 10 in front of him, his eye only rarely encounters the directly reflected light R (i.e. the observer is usually not standing at the gloss angle) This is illustrated in FIG. 10, where the observer B is outside the gloss angle and sees only the diffusely scattered light beam R'. On a smooth cover plate without structured areas inside or outside, the intensity of the diffusely scattered light R' is relatively low and shows a very strong angle dependence. Only when the diffusely scattered portion is sufficiently large, a clear color with satisfactory intensity (brightness, L-value) is obtained.

The basic principle of the mode of action of the inclined segments 17 of the structured area 15 is illustrated in FIG. 11, which shows as an example the different light paths for an observer B looking perpendicularly at the glass surface or outer surface 11 of the flat body 1. Shown are three segments 17 with different inclinations to the schematically illustrated plane GE of the cover plate 10, as well as the light rays E hitting the segments 17, which are reflected by the segments 17 in each case at the local gloss angle to the observer B (reflected light rays R). The central segment 17 is arranged parallel to the plane GE, whereby the incident light beam E hits the segment 17 vertically and is reflected vertically to the observer B (reflected beam R). For the central segment 17, the gloss angle and the local gloss angle are identical. For the two adjacent segments 17, the incident light rays E each have an angle different from zero to the surface normal on the plane GE and also hit the observer B in the local gloss angle. Due to the different inclinations of the segments 17, light from different directions is reflected in each case in the local gloss angle of the segments 17 to the observer B looking perpendicularly on the module surface. In the example of FIG. 11, the angles of incidence and reflection are 45° maximum.

In FIG. 12 a situation is shown where the observer B looks at the plane GE of the cover plate 10 at an angle of 45° to the surface normal. As in FIG. 11, three segments 17 with different inclinations to the plane GE of the cover plate 10 are shown as an example, as well as the light rays E hitting the segments 17, which are reflected by the segments 17 at the local glancing angle to the observer B (reflected light rays R). Due to the different inclinations of the segments 17, light from different directions is reflected at the local gloss angle to the observer B looking at the surface. In the example of FIG. 12, the angles of incidence and reflection are 67.5° maximum. Basically, if the values of the gloss angle are relatively large, the reflected light n is shifted towards shorter wavelengths. This spectral shift can be reduced, for example, by a higher refractive index of the optical interference layer. However, the effect on the color visible to the human eye depends on the complex weighting of the spectrum with the sensitivity curves of the human eye. In the case of relatively steep surface inclinations, multiple reflections can also occur on adjacent facets.

FIG. 13 shows a situation where the light source and accordingly the incident light rays are always inclined at an angle of 45° to the plane GE of cover plate 10. The observer B observes the surface of the flat body 1 at different angles. The angles given in FIG. 13 are to be understood as follows: Angle of incidence (relative to plane GE of cover plate 10)/angle of observation or reflection (deviation from the angle of gloss relative to surface normal on plane GE). The degree character "°" is not specified. FIG. 13 shows an example of four segments 17 with different inclinations to plane GE. Only in one segment 17, whose plane is parallel to the plane of cover plate 10, the observer B is located at the gloss angle with respect to plane GE: 45/0. This means that the incident light beam has an angle of 45' to plane GE, the reflected light beam has an angular deviation of zero from the gloss angle. For the other segments 17, the observer B is outside the gloss angle. In the two left-hand segments 17 (45/90, 45/45), the observer observes the surface of the flat body 1 at an angle of 90° and 45° to the gloss angle, respectively, and the light is incident at an angle of 45° to the plane GE. In the right segment 17 (45/−15), the observer is at an angle of −15° to the glancing angle. Due to the differently inclined segments 17 and the resulting reflection in the local gloss angle, light is reflected with sufficient intensity towards the observer B even if the observer is not located in the gloss angle, relative to the plane GE of cover plate 10.

FIG. 14 shows a situation in which the observer B observes the surface of the flat body 1 always at an angle of 45° to the module surface or plane GE of the cover plate 10. FIG. 14 shows an example of four segments 17 with different inclinations to the plane GE Only in one segment 17, whose plane is parallel to the plane GE, the observer B is located at the gloss angle: 45/0. In the other segments 17, the observer B is located outside the gloss angle. In the two left-hand segments 17 (45/90, 45/45), the observer B observes the surface of the flat body 1 at an angle of 45°, whereby the light is incident at a deviation of 90° or 45° relative to the gloss angle. In the right segment 17 (45/−15) the light is incident at an angle of −15° relative to the gloss angle. Due to the differently inclined segments 17 and the resulting reflection in the local gloss angle, light is reflected with sufficient intensity towards the observer B even if light is incident outside the gloss angle.

In the flat body 1 according to the invention, a homogeneous color impression in a specifiable wavelength range can be achieved by structuring the outer surface 11 of the cover plate 10 in combination with the at least one coloring optical interference layer 16, 16', whereby the color impression is far less dependent on angle in comparison to a non-structured surface.

Figure 15:
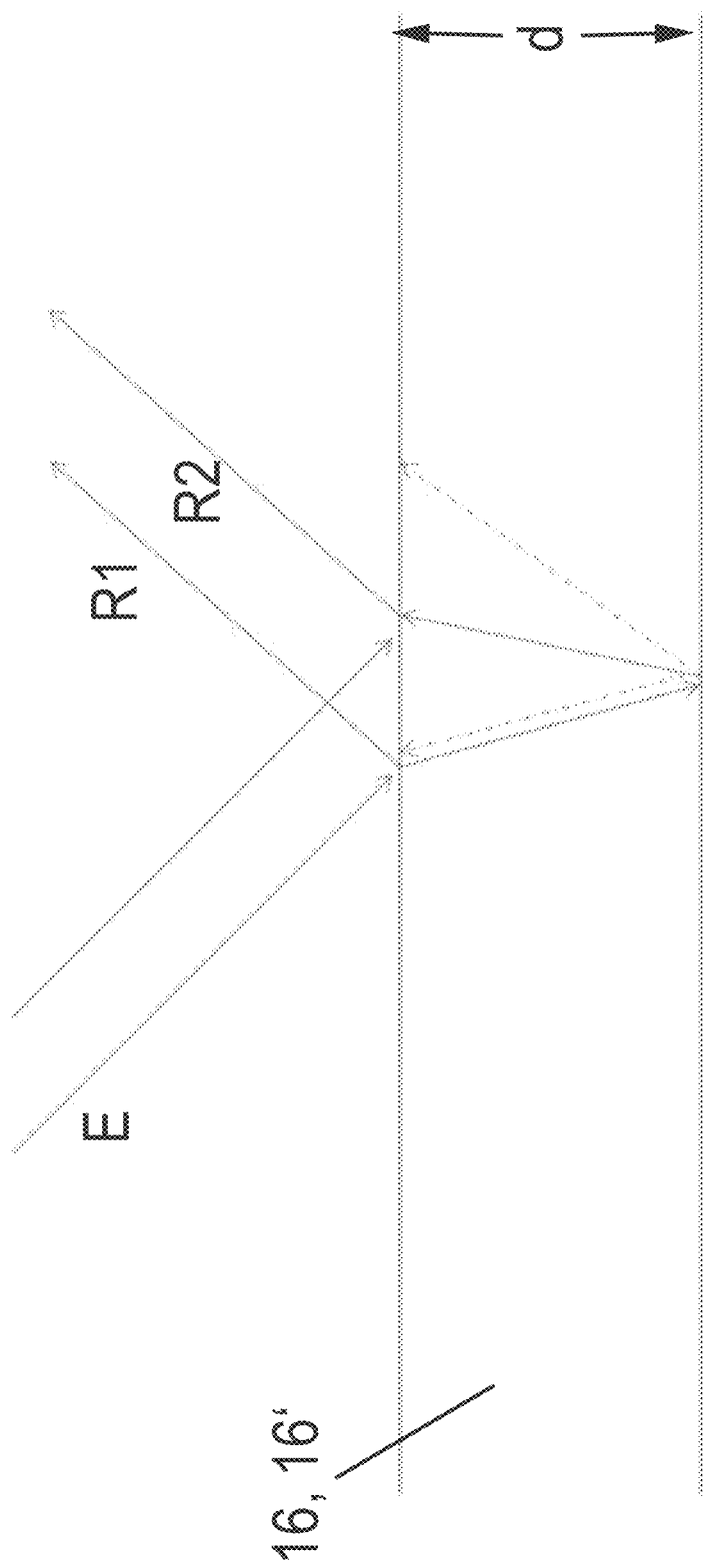

FIG. 15 shows the reflection at the optical interference layer 16, 16' with layer thickness d. The incident light beam E is reflected both at the interface atmospheric interference layer (R1) and at the interface interference layer-cover plate (R2). If the path difference of the two light beams R1, R2 corresponds to a multiple of the wavelength of the incident light beam, constructive interference occurs, while destructive interference occurs if the path difference is a multiple of half the wavelength. When illuminated with white light, the optical interference layer 9 thus acts as a color filter, since constructive interference, depending on the refractive index n and layer thickness d, only occurs for light of a suitable wavelength. Here a is the angle of the reflected rays R1, R2 to the surface normal. The light rays R' exemplify the reflected light outside the gloss angle, which can occur in the structured area 15 if the roughness of the interface between the interference layer and the cover plate is too large. In order to fulfill the interference condition, it is necessary that the scattering centers are each smaller than the wavelength and layer thickness. This can be achieved by the minimum surface area of the segments 17 and their maximum roughness, as claimed in the invention.

If the outer surface 11 of the cover plate 10 is coated with an optical interference layer 16, consisting of an inorganic, chemically inert and hard layer such as $Si_3N_4$, this results in a high scratch resistance, chemical resistance and dirt-repellent effect for the flat body 1. In addition, the use of photocatalytic layers such as $TiO_2$ can result in a self-cleaning effect. Climatic tests have also shown that interference layers of materials such as $Si_3N_4$ or $TiO_2$ also prevent the corrosion of a glass cover plate by damp heat.

Figure 16:
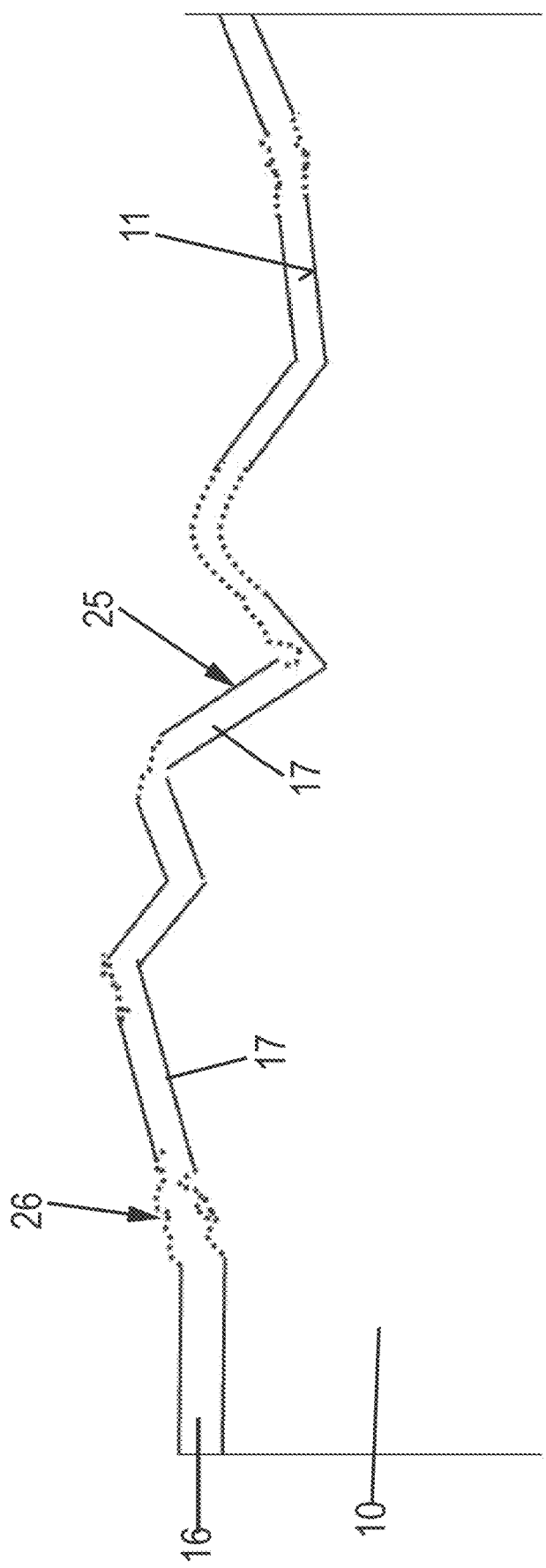
FIG. 16 an embodiment of the cover plate in a schematic cross-sectional view.

Reference is now made to FIG. 16, which illustrates an embodiment of cover plate 1. To avoid unnecessary repetition, only the differences to the embodiment of FIG. 5 are described and otherwise reference is made to the above explanations. With this embodiment, the structured area 15 of the outer surface 11 has first zones 25 and second zones 26 Here, the first zones 25 are configured in such a way that the segments 17 have a mean roughness that is less than 15% of the layer thickness d of the optical interference layer 16 on the outer surface 11. In the embodiment of FIG. 5, this applies to the entire structured area 15. In contrast, the mean roughness in the second zones 26 is so high that interference in the optical interference layer 16 is prevented. For example, the mean roughness of the segments 17 in the second zones 26 is more than 50% of the layer thickness of the optical interference layer 16 Therefore, the flat body 1 has a homogeneous color in the first zones 25, which results from the color filter effect of the optical interference layer 16. In the second zones 26, the optical interference layer 16 has no color filter effect due to the lack of constructive interference, and thus there is essentially a surface that corresponds to the flat body 1 without optical interference layer 16. Therefore, the flat body 1 can be provided with a homogeneous color in the first zones 25. In FIG. 16, the second zones 16 are schematically illustrated by a greater roughness. For reasons of simplified representation, the first zone 22, which does not contain an optical interference layer 16, is not shown. For the at least one additional optical interference layer 16', the explanations apply analogously.

Figure 17:
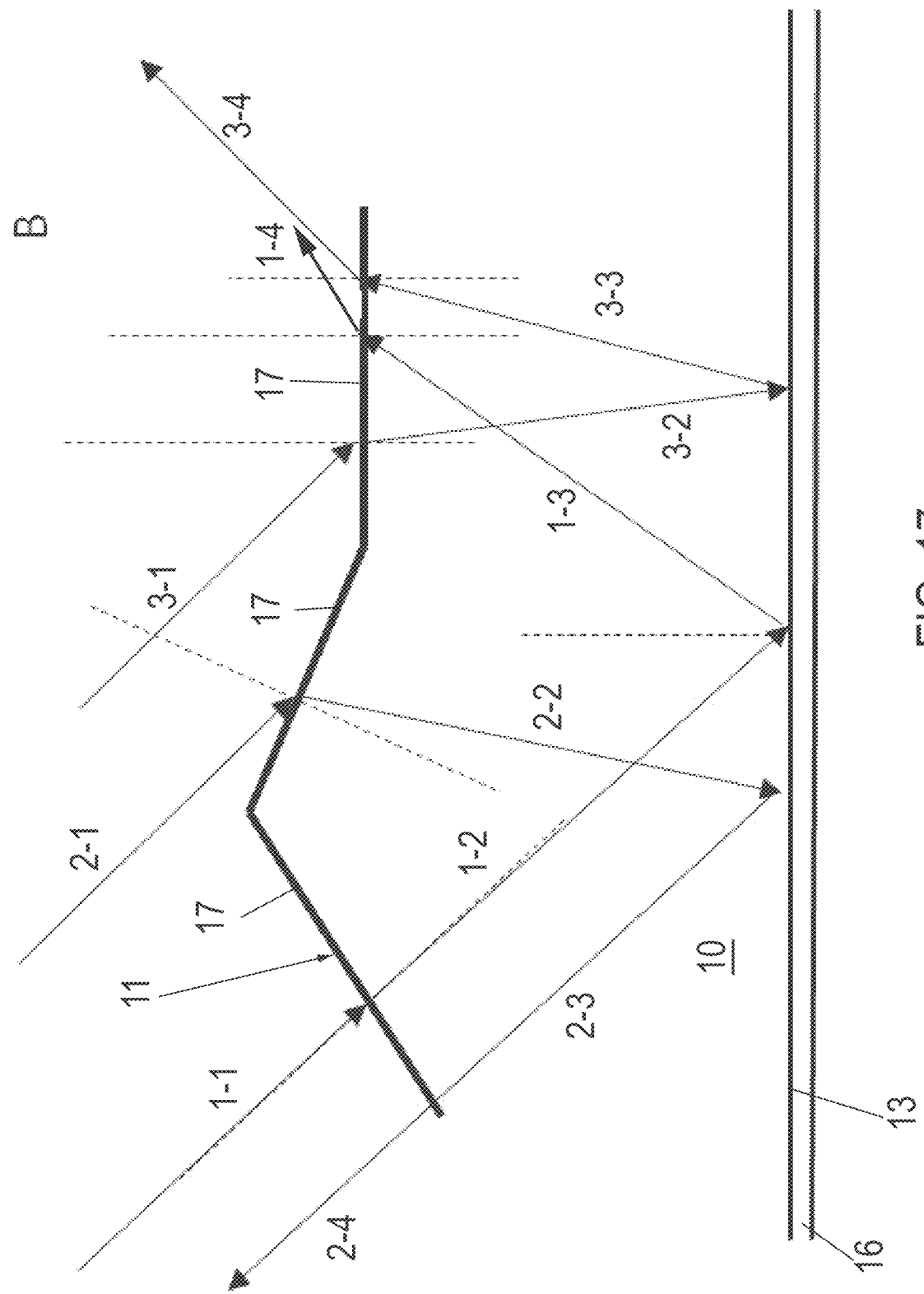
FIG. 17 a schematic representation of exemplary light paths when reflected by the cover plate with a structured outer surface in combination with the interference layer on the inside according to the embodiment of FIG. 6.

The function of the structured outer surface 11 in combination with the interference layer 16 on the inside is explained in detail in FIG. 17 in accordance with the embodiment of FIG. 6. For the sake of simplicity, the first area 22, which does not contain an optical interference layer 16, is not shown. It shows examples of different light paths for differently inclined segments 17 of cover plate 10. Three segments 17 are shown as examples, the right segment 17 being parallel to the plane of cover plate 10 and the other two segments 17 having an angle to the plane of cover plate 10 that is different from zero. The reflection of the light rays at the interference layer 16 is shown in simplified form. The reflection at the interference layer 16 is explained in connection with FIG. 12. FIG. 17 shows the light paths for three light beams, each of which hits the differently inclined segments 17 of the outer surface 11 of the cover plate 10 at the same angle to the normal of the plane of the cover plate 10. The respective perpendicular to the segments 17 is shown as a dotted line. Due to the differently inclined segments 17, the light rays are reflected in different ways. A first light beam 1-1 hits a segment 17, crosses the cover plate 2 as refracted light beam 1-2, is reflected as light beam 1-3 by the interference layer 16 (in the gloss angle), and emerges as refracted light beam 1-4 from the cover plate 10 towards the outer environment. The light beam 1-4 ultimately reflected by the cover plate 10 has a different angle to the normal to the plane of the cover plate 10 than the incident light beam 1-1, so that there is no reflection at the gloss angle but scattering. In the same way, a second light beam 2-1 hits another segment 17, crosses the cover plate 2 as refracted light beam 2-2, is reflected as light beam 2-3 by the interference layer 16, and emerges as refracted light beam 2-4 from the cover plate 10 towards the outer environment. The reflected light beam 2-4 emerges from the cover plate 10 approximately against the direction of incidence of the light beam 2-1, which is also a scattering method and not a reflection in the gloss angle. A third light beam 3-1 hits another segment 17, crosses the cover plate 10 as refracted light beam 3-2, is reflected as light beam 3-3 by the interference layer 16, and emerges as refracted light beam 3-4 from the cover plate 10 towards the outer environment. This segment 17 lies parallel to the plane of the cover plate 10, so that the light beam 2-4 is reflected in the gloss angle. It is important to note that due to the refraction at the respective segment 17 and subsequent reflection at the interface with interference layer 16 and further refraction at the structured surface, those segments 17 which are inclined to the plane of the cover plate 10, result in a strong overall reflection even outside the gloss angle (relative to the plane of the cover plate 2), so that in combination with the interference layer 16, a color effect of the reflected light is achieved even outside the gloss angle of the glass plane. FIG. 17 shows an example of the position of an observer B who is outside the gloss angle. Due to the relatively strongly (diffusely) scattering cover plate 10 with external structuring and an interference layer on the inside, there are usually suitable light paths for different viewing angles outside the gloss angle that have passed through the interference layer. This results in a color impression that is much less directional than in conventional modules without structured area 15.

FIG. 18 illustrates a measuring arrangement for determining the diffuse scattering of the flat body 1 according to the invention with a commercially available multi-angle colorimeter 20 (multi-angle color measurement). The structured area 15, which is not shown in detail, extends over the complete cover plate 10 (e.g. glass). Here, a light beam is directed onto the outer surface 11 of the flat body 1 to be characterized at different angles of incidence and the scattered or reflected light is spectrally measured from different observation angles, for example 15° (related to gloss angle) For example, at an angle of observation of 45° (measured relative to the surface normal) and an angle of incidence of 45° (measured from the gloss angle), the incident steel is exactly perpendicular to the surface (45/45). At an observation angle of 15° and an angle of incidence of 45°, the direction of incidence 30° from the surface normal is on the same side as the direction of observation (15/45). The multi-angle colorimeter 20 is positioned relative to the surface normal at an observation angle of 45' or 15°.

As can be seen from the above description of the invention, the invention provides an improved cover plate, a flat body with the improved cover plate, as well as methods for its production, which have at least two very homogeneous, intensive colors, with little or no directional dependence. The surface of the flat body can be provided with at least two colors so that colored patterns and characters encoding information can be displayed against a differently colored background. Active and passive flat bodies can be produced cost-effectively in various shapes and sizes and can be used as integrated components of a building wall or a freestanding wall, especially as facade elements. Active and passive flat bodies can be combined as facade elements in an aesthetically pleasing way. Multicolored solar modules (coloring by interference layer(s), especially CIGS thin-film solar modules, can be advantageously be made available, whereby a homogeneous color effect of the facade can be achieved. With active flat bodies, the loss of efficiency is acceptable. For passive flat bodies, the semiconductor layer stack can be replaced by other, mostly cheaper materials and other elements such as junction box, edge sealing, contact strips and cables can be eliminated. The invention is particularly advantageous for the production of multicolored fitting pieces, which are particularly necessary for the transition to openings or the edges of buildings. Passive surface elements can provide largely the same color impression under different lighting conditions as solar modules. If non-rectangular facade elements are desired to complement solar modules, passive flat bodies can be produced much more cost-effectively than solar modules. The invention thus provides an advantageous improvement that enables the production of multicolored flat bodies that have a relatively low loss of efficiency as active flat bodies. In particular, the aesthetically pleasing use of active and passive flat bodies as facade elements is possible.

What is claimed is:

1. A method for processing a transparent cover plate for a flat body, comprising the following steps of:
    a) providing the transparent cover plate having an outer side and an inner side opposite to the outer side, wherein the outer side is to face an external environment, and the transparent cover plate comprises a structured area with a light-scattering structure in at least one cover plate surface selected from an outer surface and an inner surface of the transparent cover plate, or alternatively the structured area is formed;
    b) forming of at least one first optical interference layer on a part of a cover plate side selected from the outer side and the inner side, comprising:
        b1) applying a mask to the transparent cover plate, wherein, in a vertical view through the transparent cover plate, the mask does not cover a first area of the at least one cover plate surface of the cover plate side and covers a second area of the at least one cover plate surface of the cover plate side, and the first area and the second area are arranged to overlap the structured area to be formed,
        b2) applying the at least one first optical interference layer for reflecting a light within a predetermined wavelength range to the transparent cover plate on a selected cover plate side, wherein the at least one first optical interference layer is applied in a perpendicular view through the transparent cover plate (10) in overlap with the mask and in overlap with the first area of the at least one cover plate surface;
        b3) removing of the mask, wherein the at least one first optical interference layer overlapping the mask in the vertical view, is also removed.

2. The method according to claim 1, in which at least one second optical interference layer for reflecting the light within the predetermined wavelength range is applied to the transparent cover plate on the selected cover plate side, the at least one second optical interference layer covering the first area and the second area of the at least one cover plate surface when viewed vertically through the transparent cover plate (10).

3. The method according to claim 1, wherein the transparent cover plate has on the selected cover plate side and/or a non-selected cover plate side, respectively, at least one third optical interference layer for reflecting the light within the predetermined wavelength range, the at least one third optical interference layer covering the first area and the second area of the at least one cover plate surface of the selected cover plate side when viewed vertically through the transparent cover plate.

4. The method according to claim 1, wherein a formation of the at least one first optical interference layer is repeated once or a plurality of times.

5. The method according to claim 1, wherein the outer surface has the structured area, the inner surface has no structured area and the at least one first optical interference layer is formed on a part of the inner side of the transparent cover plate.

6. The method according to claim 3, wherein the transparent cover plate has at least two optical interference layers selected from the at least one first optical interference layer, the at least one second optical interference layer, and the at least one third optical interference layer, wherein the at least two optical interference layers differ in a refractive index and/or a layer thickness.

7. The method according to claim 1, wherein the structure area comprises following features of:
    perpendicular to a plane of the transparent cover plate wherein a height profile comprising mountains and valleys, wherein an average height difference between the mountains and valleys is at least 2 µm,
    at least 50% of the structured area is composed of segments inclined to the plane of the transparent cover plate, wherein, relative to the plane of the transparent cover plate, at least 20% of the segments have an angle of inclination in a range of greater than 0° to a maximum of 15° and at least 30% of the segments have an angle of inclination in a range of greater than 15° to a maximum of 45°, wherein when the inner surface has at least one structured area, the segments of the at least one structured area of the inner surface are each flat, have a segment area of at least 1 µm² and a mean roughness of less than 15% of a layer thickness of the at least one first optical interference layer on the inner surface.

8. The method according to claim 7, wherein at least 80% of the structured area is composed of the segments inclined to the plane of the transparent cover plate, and/or the at least 30% of the segments have the angle of inclination in the range from greater than 0° to the maximum of 15°, at least 40% of the segments have the angle of inclination in the range from greater than 15° to the maximum of 45° and less than 10% of the segments have an angle of inclination greater than 45°, or the at least 40% of the segments have the angle of inclination in the range from greater than 0° to the maximum of 15°, at least 50% of the segments have an angle of inclination in the range from greater than 15° to the maximum of 45° and less than 10% of the segments have the angle of inclination greater than 45°.

9. The method according to claim 8, wherein the average height difference between the mountains and valleys is at least 50 µm or at least 100 µm.

10. A method for producing a flat body, comprising the method for processing the transparent cover plate according to claim 1.

11. A transparent cover plate for a flat body processed by the method according to claim 1, comprising the outer side and the inner side opposite to the outer side, wherein the outer side is to face the external environment, the at least one cover plate surface, selected from the outer surface and the inner surface, has the structured area with the light-scattering structure, the at least one first optical interference layer for reflecting the light within the predetermined wavelength range is arranged on the cover plate side selected from the outer side and the inner side, wherein the at least one first optical interference layer is arranged over the first area of the at least one cover plate surface of the cover plate side and is not arranged over the second area of the at least one cover plate surface of the cover plate side, wherein the first area and the second area are arranged in the vertical view through the transparent cover plate in overlap to the structured area.

12. The transparent cover plate according to claim 11, comprising at least one second optical interference layer and at least one third optical interference layer on the selected cover plate side, wherein the at least one second optical interference layer and the at least one third optical interference layer cover the first area and the second area of the at least one cover plate surface of the selected cover plate side when viewed vertically through the transparent cover plate.

13. The transparent cover plate according to claim 12, wherein the at least one second optical interference layer and the at least one third optical interference layer are located on one or both sides of the at least one first optical interference layer.

14. The transparent cover plate according to claim 11, comprising the at least one third optical interference layer on a non-selected cover plate side, the at least one third optical interference layer covering the first area and the second area of the at least one cover plate surface of the selected cover plate side when viewed vertically through the transparent cover plate.

15. A flat body, wherein the flat body is a light-absorbing flat body, wherein the light-absorbing flat body is a photovoltaic solar module, a thermal solar collector or a passive colored façade element comprising the transparent cover plate according to claim 11.

16. The method according to claim 2, wherein a formation of the at least one first optical interference layer is repeated once or a plurality of times.

17. The method according to claim 3, wherein a formation of the at least one first optical interference layer is repeated once or a plurality of times.

18. The method according to claim 2, wherein the outer surface has the structured area, the inner surface has no structured area and the at least one first optical interference layer is formed on a part of the inner side of the transparent cover plate.

19. The method according to claim 3, wherein the outer surface has the structured area, the inner surface has no structured area and the at least one first optical interference layer is formed on a part of the inner side of the transparent cover plate.

20. The method according to claim 4, wherein the outer surface has the structured area, the inner surface has no structured area and the at least one first optical interference layer is formed on a part of the inner side of the transparent cover plate.

* * * * *